United States Patent
Pumphrey

[19]

[11] Patent Number: 5,919,120
[45] Date of Patent: Jul. 6, 1999

[54] TOOL CHANGER METHOD

[75] Inventor: Dennis M. Pumphrey, Torrance, Calif.

[73] Assignee: Excellon Automation, Co., Torrance, Calif.

[21] Appl. No.: 08/854,015

[22] Filed: May 8, 1997

Related U.S. Application Data

[62] Division of application No. 08/548,353, Nov. 1, 1995, Pat. No. 5,716,310.

[51] Int. Cl.$^6$ .................................................. B23Q 3/155
[52] U.S. Cl. ............................. 483/1; 483/4; 483/13; 483/52
[58] Field of Search ............................. 483/1, 4, 51, 53, 483/13, 36, 52

[56] References Cited

U.S. PATENT DOCUMENTS

| | | | |
|---|---|---|---|
| 3,590,463 | 7/1971 | Burroughs | 483/1 |
| 3,715,801 | 2/1973 | Sato et al. | 483/1 |
| 3,932,924 | 1/1976 | Anderson | 483/1 |
| 4,514,892 | 5/1985 | Tsujimura et al. | 483/52 |
| 4,543,636 | 9/1985 | Noda et al. | 364/474 |
| 4,951,375 | 8/1990 | Erlenmaier | 483/4 |
| 5,007,157 | 4/1991 | Winkler et al. | 483/30 |
| 5,041,985 | 8/1991 | Fujita | 483/1 |
| 5,068,958 | 12/1991 | Kosmowski | 483/1 |
| 5,224,915 | 7/1993 | Kilian | 483/1 |
| 5,249,348 | 10/1993 | Hall | 483/18 |
| 5,688,214 | 11/1997 | Mase et al. | 483/1 |

FOREIGN PATENT DOCUMENTS

| | | | |
|---|---|---|---|
| 4032003 | 4/1992 | Germany | 483/1 |
| 61-219548 | 9/1986 | Japan | 483/1 |
| 2-180536 | 7/1990 | Japan | 483/51 |

*Primary Examiner*—Andrea L. Pitts
*Assistant Examiner*—Christopher Kirkman
*Attorney, Agent, or Firm*—Henry G. Kohlmann

[57] ABSTRACT

In a tool changer system comprising one or more tool grippers together with a pressure foot insert change pod supported on a U-V slide which is independent of the machine work table. The slide services a tool magazine mounted on the machine tool in close proximity to the work table. Because the tool changer is independent of the machine table, the selection and retrieval of the next tool to be used is performed while the machine tool is working in a work cycle. Similarly, the replacement of the used tool back into its storage location is also performed while the machine tool is working. Exchange of the pressure foot insert is also done as part of the tool change process in part during the tool change work cycle. Time is saved because the machine tool work need not be interrupted and the machine tool table need not be moved to accommodate the tool change. In addition, adjustment of tool tip positioning may also be accomplished off line during the machine tool cycle by control of a tool gripper with multiple positions which allows the tool to be dropped to an adjustment pad and gripped at a known distance. When the tool is ultimately inserted into the spindle the position of the tip of the tool is known with precision.

10 Claims, 23 Drawing Sheets

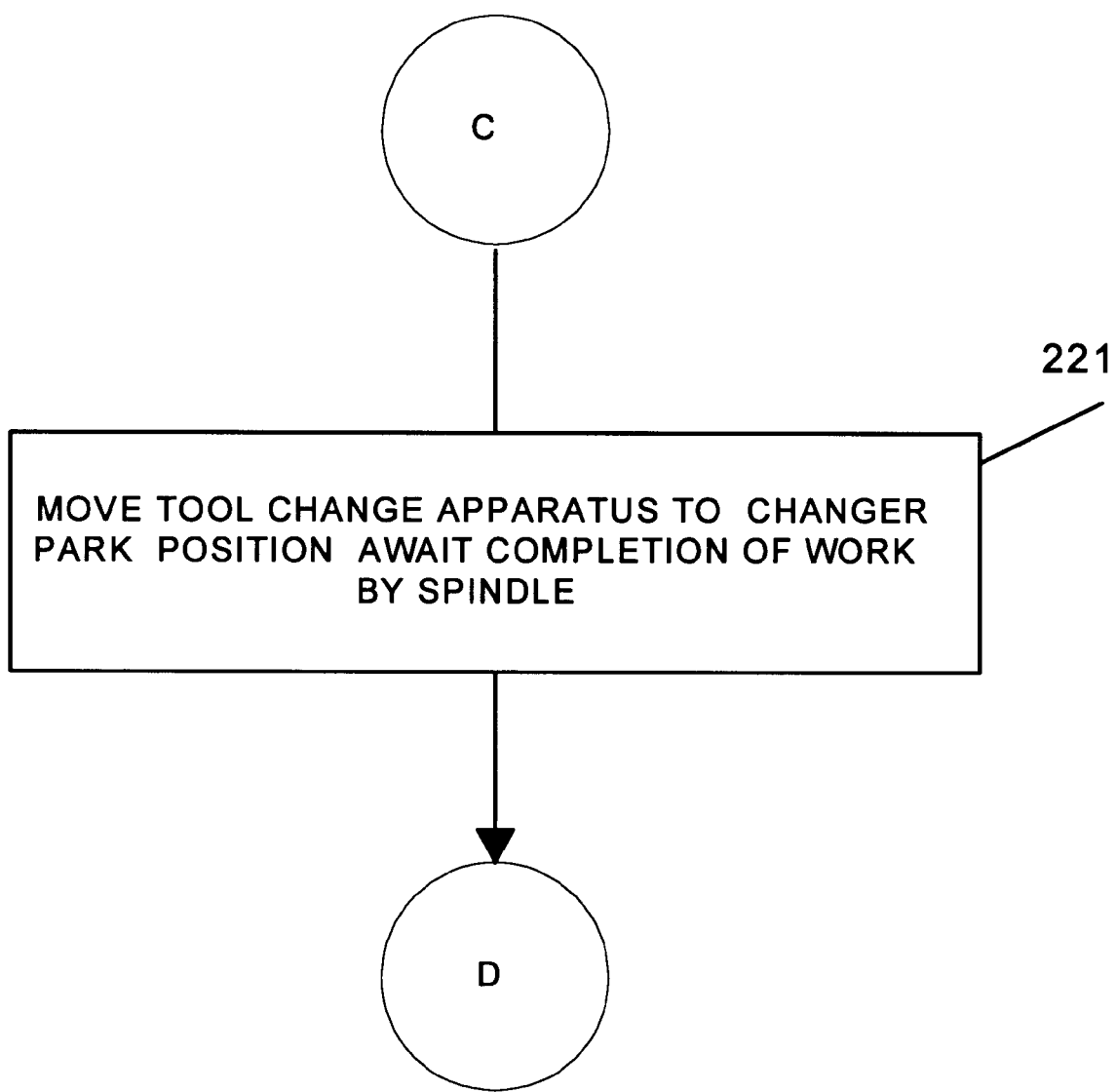
FIGURE 9D1

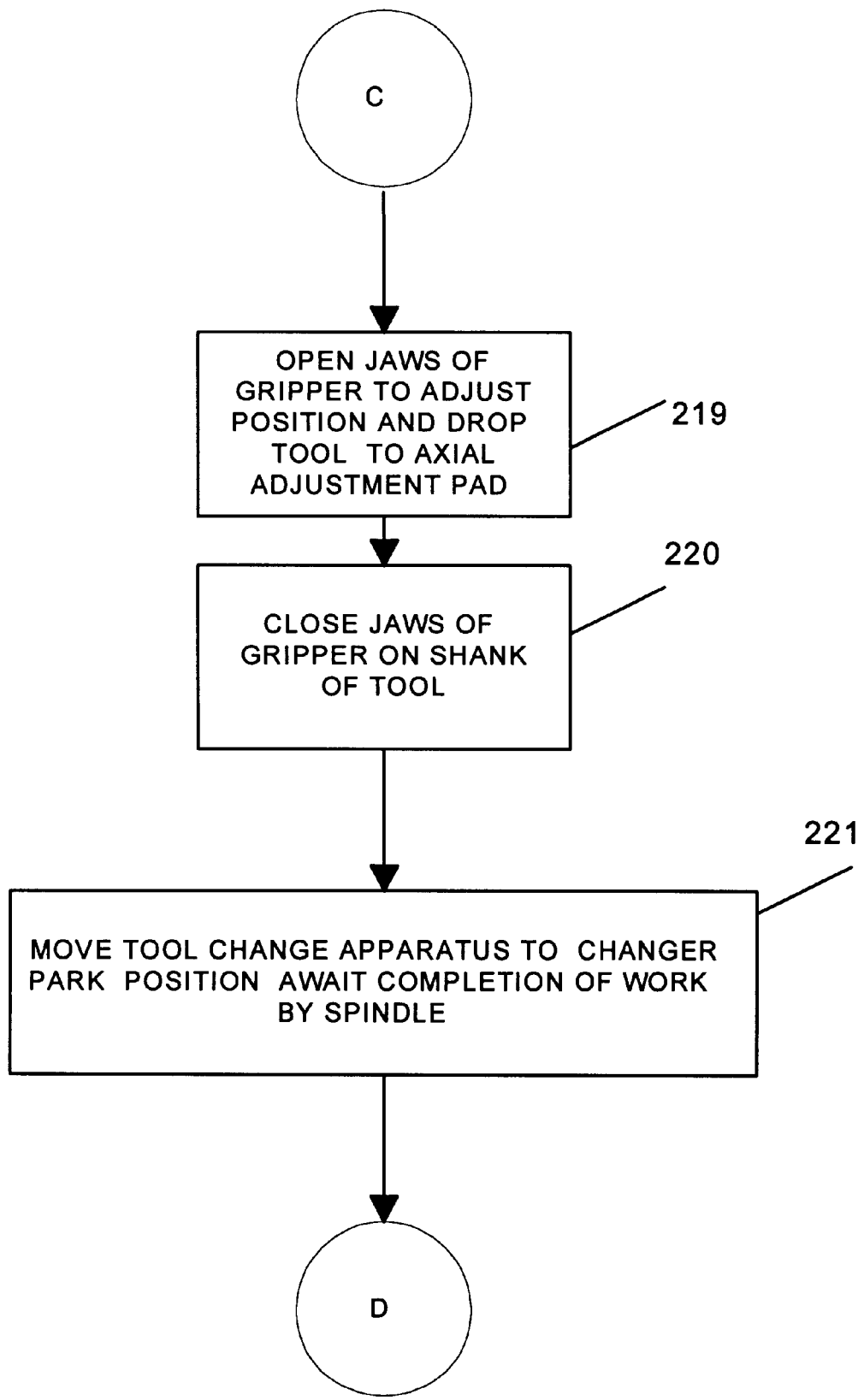
FIGURE 9D2

TOOL CHANGER METHOD

This application is a division of application Ser. No. 08/548,353, filed Nov. 1, 1995, now U.S. Pat. No. 5,716,310.

BACKGROUND OF THE INVENTION

1. Field of the Invention

The present invention relates to a device and a method of exchanging a tool between a tool exchange holding device and a spindle which is capable of approaching and moving way from the tool exchange holding device. More particularly this invention relates to a device which retrieves tools from a tool holding device while the spindle continues to work and prior to exchanging of the tool in a spindle.

2. Description of Related Art

Various mechanisms have been designed for loading and unloading tools into the spindle of printed wire board drilling and routing machines and other automatic machine tools. These are typified by U.S. Pat. No. 5,111,573 to ITO, U.S. Pat. No. 5,407,416 to OTTONE et. al., and U.S. Pat. No. 5,068,958 to KOSMOWSKI. Most of these systems store the tools in a magazine or a tool holder which is serviced from a tool changer mounted on the work table of the machine. The result of mounting the tool changer on the machine work table is to increase the amount of time required to change tools due to the movement of the work table to position the changer under the spindle, as well as affecting the speed at which the table can be positioned due to the extra weight of the tool changer mechanism. This occurs because the tool change process cannot begin to take place until the machine stops working. A typical tool change sequence is for the work table with tool changer to first move the work table to position the tool changer under the spindle, the tool is removed from the spindle and the work table moves to position the tool changer to the appropriate position under a magazine to return the tool to the magazine. Then the tool changer is positioned to extract the next tool from the magazine, remove it and then move back under the spindle at which time the tool is inserted into the spindle.

A similar situation exists with the pressure foot insert which are disclosed in U.S. Pat. No. 5,249,348 to Hall which is used to hold stacked printed wire boards for example, down against the machine work table during machining. Typically these inserts are mounted in separate holders which are also serviced by a changer mounted on the machine work table. Again the result is similar to that experienced with the tool changers, mounted in similar fashion, namely the time to change the insert is increased due to the fact that the changer is attached to the machine work table and the work table must be moved to position the tool changer to a tool change position accessible by the spindle.

Current tool changer designs reduce machine productivity because during the tool change process work is not being done. Since as much as 30 percent of the time spent drilling printed wire boards, for example, may be consumed by changing tools, a more time efficient means is very desirable.

In addition, where tools do not have collars, it is uncertain how much of the tool projects from the end of the spindle when loaded. This happens because the drill may have been resharpened and is shorter than when new or it may not have been inserted into the tool storage cassette the same distance as every other tool in the cassette. Thus, when the tool change mechanism grips a tool without a collar, it does so in an unspecified location which affects the distance the tool will ultimately project from the spindle.

Consequently, a coarse axial adjustment of the tool normally must be first made so that the location of the tool tip is approximately known. Typically, this is done after the tool is inserted into the collet of the spindle by a sequence of operations which entail opening and closing the collet of the spindle and transfer mechanism collets or grippers and a repositioning of the spindle in the axial direction. Such a system is described in U.S. Pat. No. 5,068,958. After the coarse adjustment is made, the spindle is positioned over a gauge which measures the location of the tool tip precisely and enters an offset value or correction factor into the computer to compensate for different tool tip distances. The coarse adjustment is time consuming and produces unreliability due to the wear and tear on the collet of the spindle and transfer collet or gripper mechanisms occasioned by the repeated opening and closing thereof. Total tool change time is increased as a result.

SUMMARY OF THE INVENTION

The present invention consists of a tool changer system comprising one or more tool grippers together with a pressure foot insert change pod supported on a U-V slide which is independent of the machine work table. The slide services a tool magazine mounted on the machine tool in close proximity to the work table. Because the tool changer is independent of the machine table, the selection and retrieval of the next tool to be used is performed while the machine tool is working. Similarly, the replacement of the tool back into its storage location is done while the machine tool is working. The exchanging of the pressure foot insert when required may be performed as part of the tool change process. Time is saved because the work table does not have to be moved to position the tool changer under the spindle.

An alternative embodiment of this invention avoids complex adjustment of certain types of tools when loading the same into the machine spindle where the precise location of the tool tip is unknown. Such adjustment occurs whenever tools without positioning collars are stored in the magazine. The instant invention permits such adjustment "off line" while the machine tool is working on an work piece thereby saving additional time and increasing the output of the machine.

It is an object of this invention is to provide a tool changer which will significantly reduce the time required to change tools and pressure foot inserts on a printed wire board drilling/routing machine and other computer controlled machines.

It is a further object of this invention to provide a tool changer which will retrieve and store tools while the machine tool continues to operate on the work piece.

It is a further object of this invention to provide a tool changer which has a built in base for the positioning of the tip of a retrieved tool at a known distance.

It is a further object of this invention to provide a tool changer which can store pressure foot inserts near the spindle during the tool changing process.

It is a further object of this invention to provide a set of programmed instructions which will permit retrieval and storage of tools while the machine tool continues to work on a work piece.

BRIEF DESCRIPTION OF THE DRAWINGS

FIGS. 9A through K, are flow charts of the operation of the computer system for tool staging and transfer.

DESCRIPTION OF THE PREFERRED EMBODIMENT(S)

Independent U-V Slide System

Figure 1:
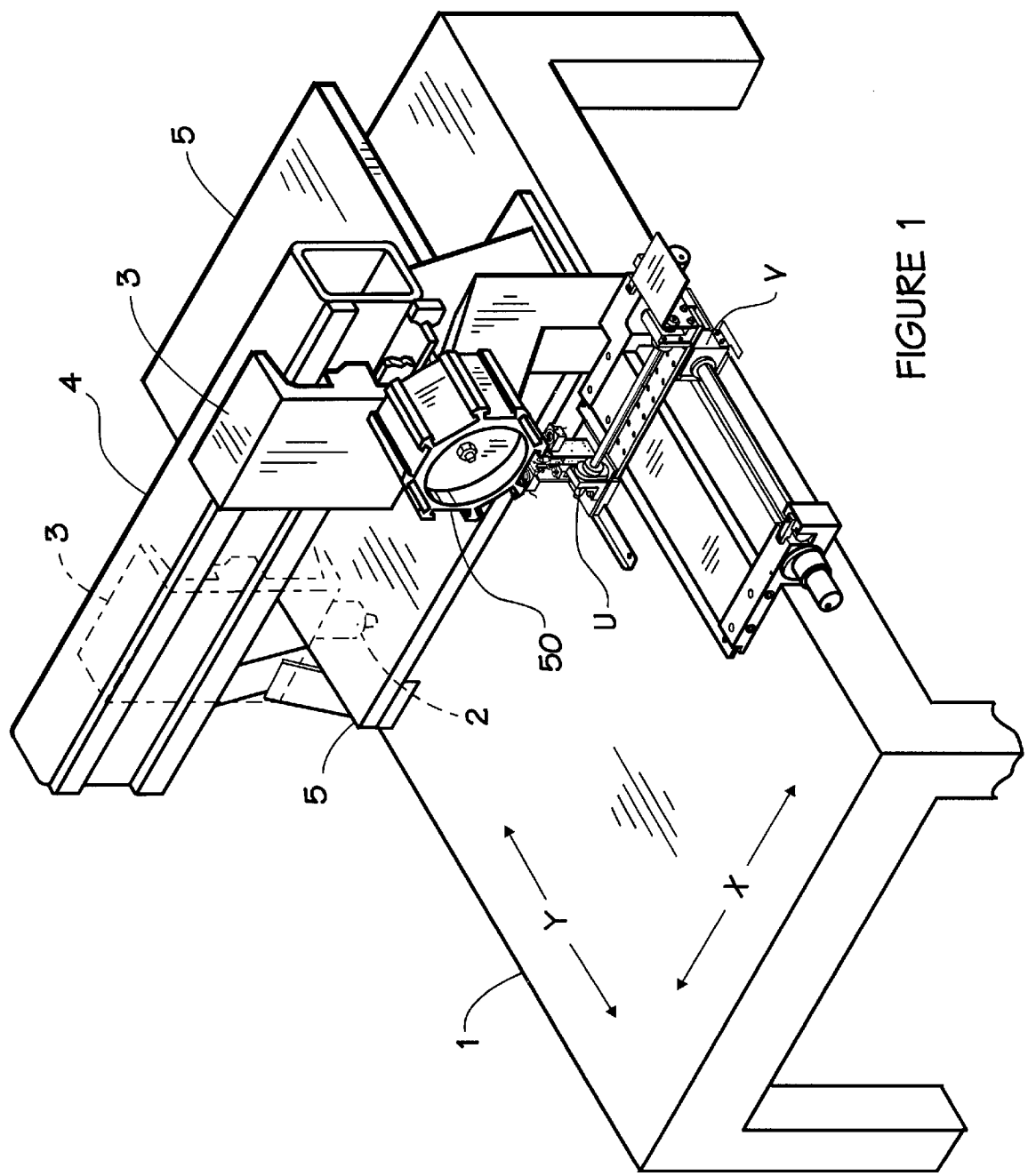
FIG. 1 is a perspective view of the machine tool platform with the tool change assembly mounted below the tool magazine.

FIG. 1 shows a tool transfer assemblies mounted on an U slide structure "U". The slide structure U is shown mounted on top of a V slide structure "V". The entire tool change assembly is mounted directly on the machine tool platform 1 but off to one side of the work table and independent thereof and beneath the tool magazine 50.

The slide structure U is adapted to be moveable parallel to the X direction of the machine tool, ie. the direction of motion of the spindle 2 and its mount 3 (shown in dotted lines in a work position and in solid lines at a tool change position) in the X direction along a slide tube 4. Slide structure V is adapted to be moveable parallel to the Y direction of the machine tool, ie. the direction of motion of the work table 5.

The motion of the work table 5 and the spindle 2 about various axes is well known in the art and discussion of the table motion and servo motor control thereof has therefore been omitted.

The V-Slide Structure

Figure 2:
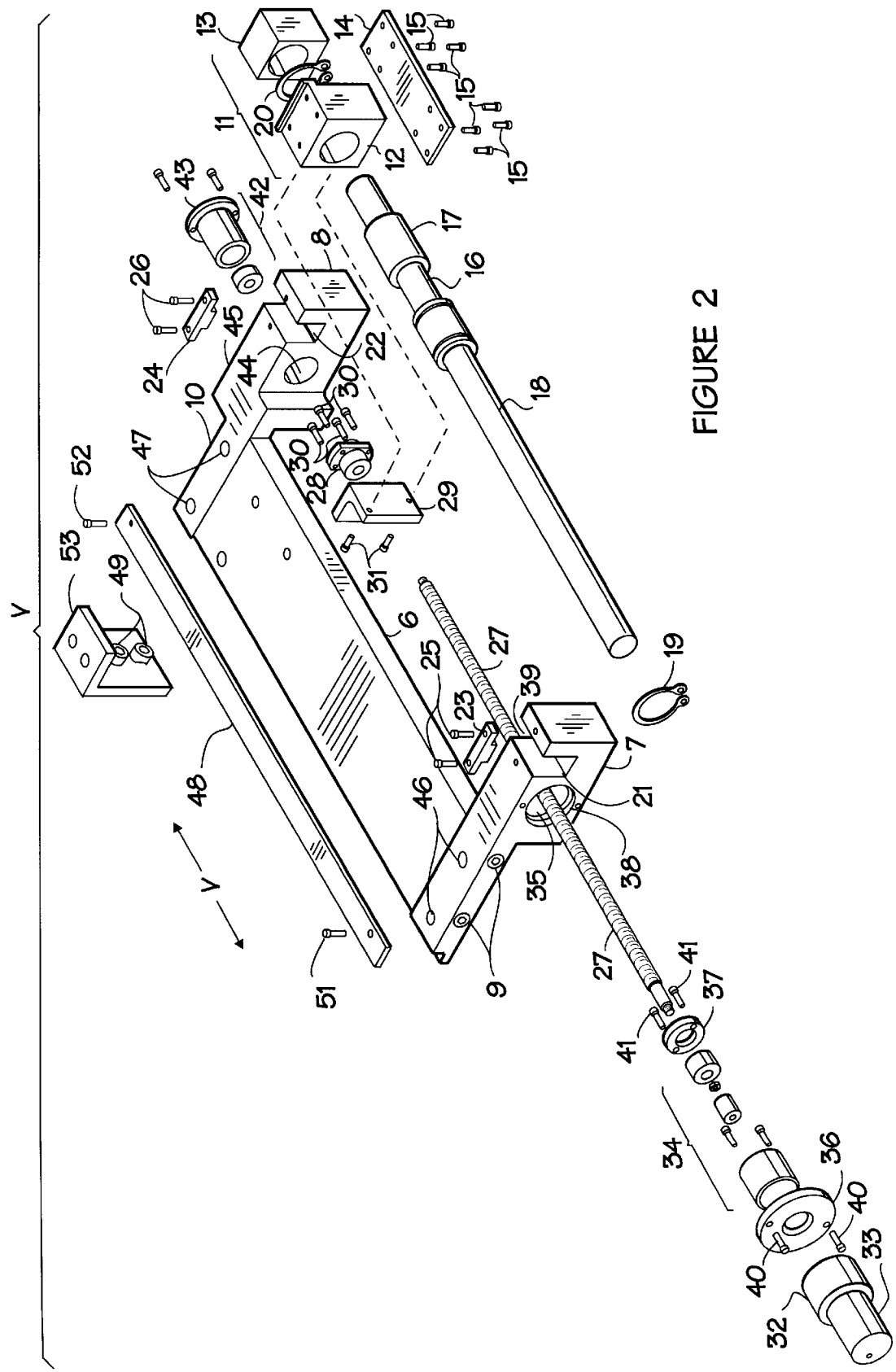
FIG. 2 is an exploded view of the V slide structure.
Figure 5:
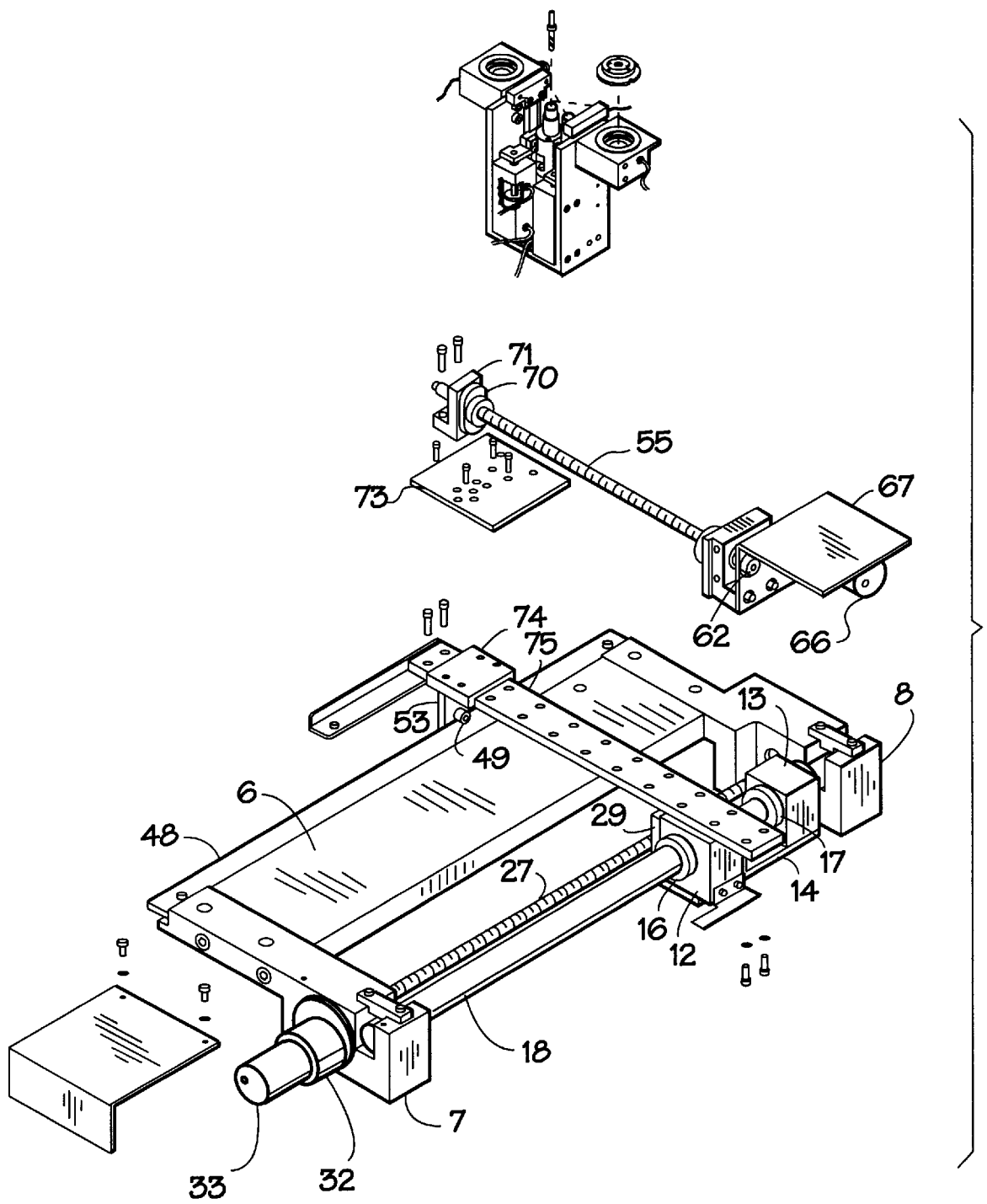
FIG. 5 is an exploded view of the U and V slide structure with the tool change assembly.

FIG. 2, shows the slide structure V in exploded form, which comprises an elongated base 6 which includes a front mount 7 and a rear mount 8. The front mount 7 and the rear mount 8 are mounted to the elongated base 6 by a plurality of bolts or screws 9 and 10 (not shown) or may be made integral therewith. A slide 11 which may be moved along the longitudinal axis of the V slide structure in the V direction comprises a pair of bearing housings 12 and 13 which are spaced apart and mounted to a plate 14 by a plurality of screws 15. The bearing housings receive a pair of bearings 16 and 17 which slideably receive a slide support tube or rod 18. The bearings 16 and 17 are retained in the bearing housings by retainer rings 19 and 20 which are received by the bearing housings 12 and 13. The bearings 16 and 17 permit the V slide structure to move along the support tube 18. The support tube 18 is mounted in slots 21 in the front mount 7 and 22 in the rear mount 8 and held in place by a retaining block 23 in the front mount 7 and a retaining block 24 in the rear mount 8. The retaining blocks 23 and 24 are attached to the respective mounts by screws 25 and 26 respectively and fixedly retain support tube 18. A lead screw 27, is coupled to the slide 11 through a lead screw nut 28 mounted on a bracket 29 (alternatively the bracket may be threaded) through a plurality of screws 30. The bracket 29 is attached to bearing housing 12 of the slide 11 through a plurality of screws 31 or other fasteners or may be made integral therewith. The lead screw 27 is driven by a servomotor 32, with digital encoder 33, which is connected to the lead screw 27 at one end and is controlled by a controller or computer of the machine tool which signals the servo motor 32 to rotate the lead screw 27 to position the lead screw nut 28 to commanded positions, as is well known. The lead screw 27 is mounted to the front mount 7 through a set of bearings 34, which are housed in a cylindrical hole 35 in mount 7. End caps 36 and 37 are screwed into place in annular ridges 38 and 39 (not shown) respectively by screws 40 and 41 at said cylindrical hole 35 to hold the bearing set 34 in place. Another set of bearings 42 are received in a cylindrical hole 44 in the rear mount 8 and receive the other end of the lead screw 27 and permit rotation thereof. Bearing set 42 is held in place by an end cap 43 made integral therewith which is received by another annular recess 45 (not shown) in said cylindrical hole 44. A slide plate 48 is mounted at one end on a notch in the front mount 7 and at the other end on a notch in the rear mount 8 by screws 51 and 52, adjacent the base 6 and receives a pair of cam follower rollers 49 mounted above and below the plate 48. The cam follower rollers 49 are rotatable mounted on a bracket 53 which is attached to the slide plate 54 of the V slide structure as shown in FIG. 5.

The base 6 is fastened to the machine tool platform 1 by screws 46 and 47 for rigidity and to enable proper positioning of the tool changer under the tool storage magazine 50 as shown in FIG. 1.

The U Slide Structure

Figure 3:
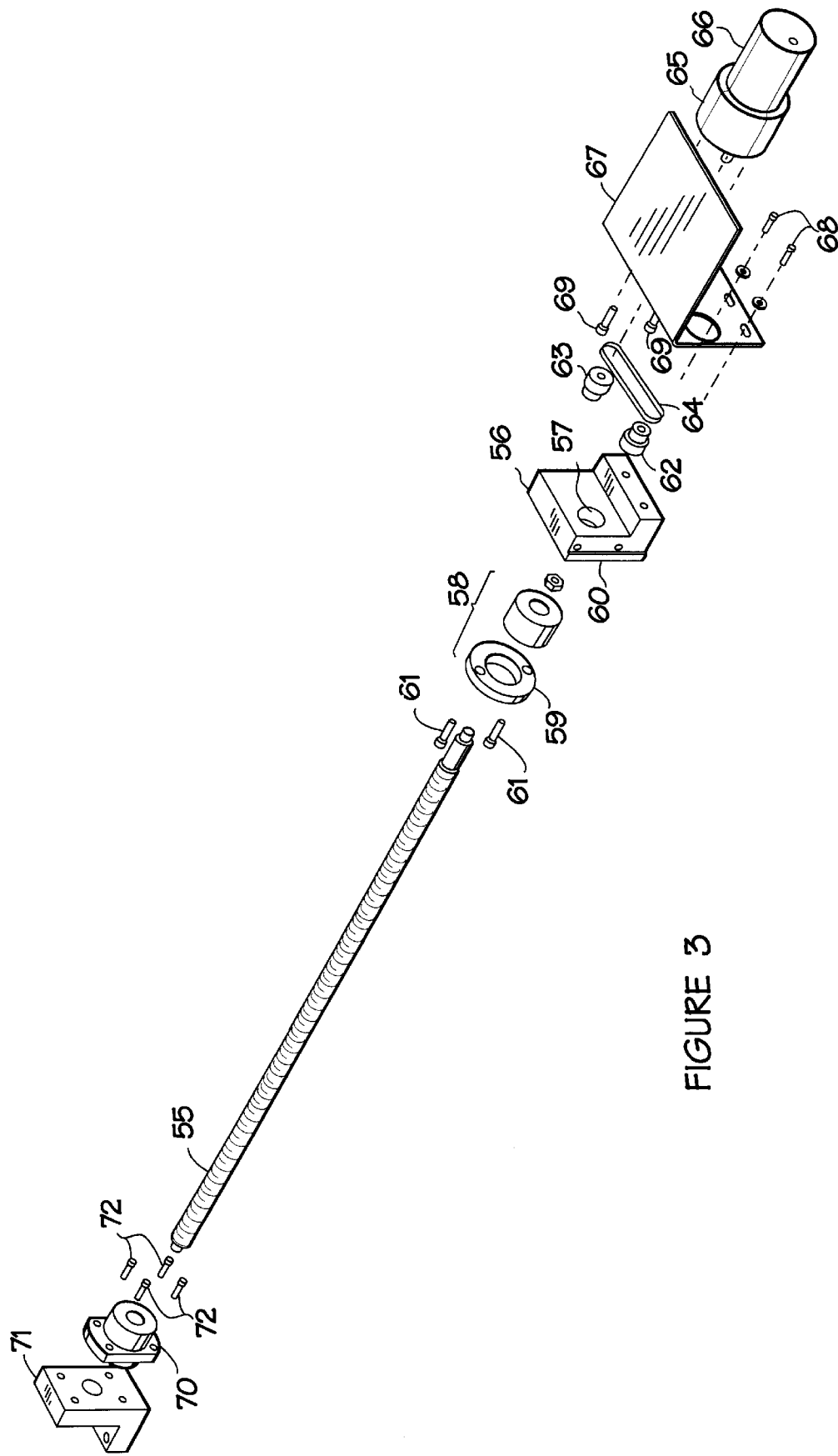
FIG. 3 is a exploded view of the U slide structure.

Referring now to FIG. 3, a U directional lead screw 55 is mounted to a mount 56 which has a cylindrical hole 57 for receiving a bearing set 58. Bearing set 58 receives the end of the lead screw 55 and is held in place in said mount 56 by an end cap 59 which is received by an annular recess 60 in cylindrical hole 57. The end cap 59 is held in place on said mount 56 by screws 61. A first pulley 62 is mounted on the end of lead screw 55 and is driven by a belt 64 which is mounted to a second pulley 63. Said second pulley 63 is driven by a servomotor 65 with digital encoder 66. A cover 67 is attached to said mount with screws 68. The servomotor 65 is attached to said mount by screws 69. A lead screw nut 70 is attached to a mount 71 by screws 72 and is adapted for adjustably receiving said lead screw 55.

Figure 4A:
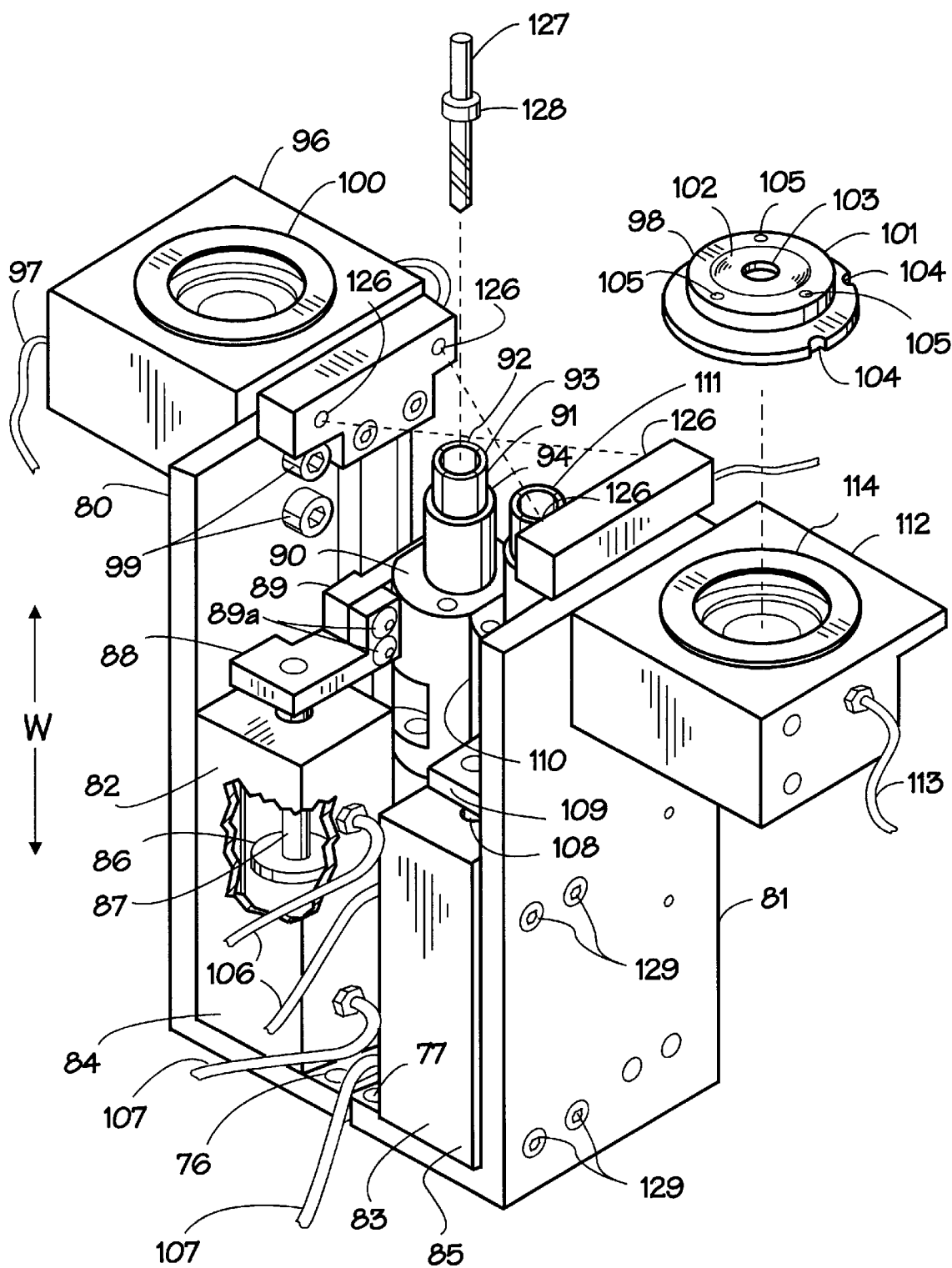
FIG. 4A is a perspective view of the tool change assembly utilizing collet transfer mechanisms.

FIG. 4A shows an embodiment of the tool transfer assembly utilizing collets for changing tools with collars. The tool transfer assembly includes two mounts 80 and 81 which have a pair of pneumatic cylinders 82 and 83 for movement of either of the transfer assemblies in the W direction which although housed in rectangular housings 84 and 85 respectively, have cylindrical chambers.

The break away portion of housing 84 shows a cylindrical piston 86 and a piston rod 87 which are adapted to move in the W direction (the Z direction of the spindle 2) and raises and lowers the piston rod head 88. Piston rod head 88 attached to a slide mount 89 by screws 107 which supports a collet housing 90, which includes a collet 91. Slide mount 89 is slideably attached to a guide 95 which is attached to or made integral with the mount 80. Air pressure lines 106 and 107 are used to move the piston 86 in the W direction thereby raising or lowing the transfer assembly housing collet 91. Collet 91 comprises two cylindrical sections. An upper cylindrical section in the form of a hollow cylindrical tube 92 with a plurality of slits 93 in the sides there of on the upper portion of tube 92 only which are parallel to the longitudinal axis of the cylindrical tube 92. Cylindrical tube 92 is slidably adjustable with respect to said housing 90 in the W direction. The slits cause the upper portion of tube 92 to spread open unless restrained which permits the upper portion to accept tools with collars. A lower cylindrical section is also in the form of a hollow cylindrical tube 94 mounted to the housing 90, having an inside diameter substantially equal to the outside diameter of cylindrical tube 92 which is adapted to slidably receive said cylindrical tube 92. The slits 93 are so positioned that when the tube 92 is in a raised position. The slits 93 clear the top of tube 94 causes the slits 93 spread opening the collet 91. When the cylindrical tube 92 is lowered the inside diameter of tube 94 covers at least a portion of the slits 93 and causes tube 92 to close thereby gripping the collar of the tool. A lower pneumatic piston not shown is mounted below the collet 91 and is attached to the base of said tube 92 and may be selectively operated to raise and lower tube 92.

The guide 95 is provided with sensors 126 mounted on the rear and at the bottom of mount 80 and 81 to detect if either section of the transfer assembly is in the raised or lowered position.

The top of guide 95 is provided with a pair of sensors 126 which are directed diagonally across the top of the entire transfer assembly for detection of the raised or lowered position of either of the collets. Output of the sensors is sent as input to the to the computer.

When the spindle is lowered and the cylindrical tube 92 is raised to the open position, and the transfer assembly is raised by pneumatic cylinder 84, the tube 92 is pressed against the collar of the tool. However, the stroke of the piston 86 is such that it will not have reached its full extension. When the cylindrical collet 92 of the collet housing 81 is lowered continued pneumatic pressure on piston 86 will move the transfer assembly upwards and hold the collet against the collar 198 of the tool 197.

In order to drill a number of stacked work pieces at once a pressure foot insert 98 is utilized. The pressure foot insert 98 is a disk shaped member having a central hole 103 through which the tool extends. It is first pressed down on the stack of work pieces to hold them in place during drilling. In the instant invention, the pressure foot insert 98 is held in place on the nose of the spindle by a number of permanent magnets 105 mounted about the surface of the insert 98. The tool or drill bit passes through the central hole 103 of the pressure foot insert as the spindle 2 drills the stack. If the computer determines that the diameter of the next tool to be used be such that the tool or the transfer collets are not able to pass through the central hole 103 of the pressure foot insert 98, the pressure foot insert 98 must be removed before the tool change can be accomplished.

Mounted on the tool change assembly is a pressure foot insert storage pod 96 along with a vacuum line 97 for applying a vacuum to hold a pressure foot insert 98 in place during the tool change process until mounted on the nose of the spindle 2. The storage pod is mounted to mount 80 by bolts or screws 99. The pressure foot insert 98 is mounted on the receiving collar 100 and vacuum is applied through vacuum line 106 to hold the pressure foot insert 98 on the pod 96 until the same is mounted on the nose of the spindle 2. FIG. 4A shows a typical pressure foot insert positioned above the second pod 112 which has a cylindrical center 101 with a concave central section 102 in the top thereof. The central hole 103 may be of various diameters dependent upon the size of the tool passing through the insert 98. A plurality of permanent magnets 105 are shown spaced about the periphery of the top of the insert 98 and a docking collar 102 is about the periphery of the bottom of the center 101 and has positioning notches 104 in the edges thereof.

In the event the opening 103 in the insert is not large enough to allow the tool change assembly to pass through as a tool is inserted or removed from the collet of the spindle 2, the pressure foot insert 98 must first be removed prior to the tool change. Accordingly, a place is needed to store the insert during the tool change operation or until such insert is otherwise required. Location of the pressure foot storage pods 96 and 112 next to the tool transfer collets or gripper assembly minimizes the time the spindle 2 is involved in the removal of the pressure foot insert 98, its storage on the storage pods 96 or 112 and the return of the pressure foot insert 98 to the nose of the spindle 2 after tool change.

Further description of the structure of the pressure foot insert and the collet are omitted as these are known in the art.

The transfer assembly structure on mount 81 is identical to that on mount 80 and is configured in a generally the same manner and operates in the same way. Each is mounted to mount 80 and 81 through screws 199.

Referring to mount 81, housing 84 also contains a piston (not shown) which moves in the W direction and raises and lowers a piston rod 108 attached to the piston rod head 109. Piston rod head 88 attached to a slide mount (not shown) which supports a collet housing 110, which supports a collet 111. A lower pneumatic piston not shown is mounted below the collet 111 and activates the slit tube of the collet in the same manner as described before.

A second pressure foot insert storage pod 112 along with a vacuum line 113 for holding a pressure foot insert in place until mounting the same on the nose of the spindle 2, is also attached to mount 81 in the same manner as described before. The pressure foot insert is mounted on the receiving collar 114 and vacuum is applied through vacuum line 113 to hold the pressure foot insert on the pod 112 until the same is mounted on the nose of the spindle 2.

FIG. 5 shows the combined U, V and W structure. In addition, to the previously described structure, a mounting plate 73 is attached to the V slide structure by attachment of the mounting plate 73 by screws 196 to a U shaped slide mount 74 which houses bearings for sliding said mount along a slide bar 75. The opposite end of slide bar 75 is attached to the bearing housing 12 of slide 11. The cam follower rollers 49 are attached to the opposite end of slide bar 75 and engage slide plate 48 as described previously. The U slide structure is attached to the end of the slide bar adjacent the lead screw bracket 29 by screws 194. The lead screw bracket 71 is attached to the mounting plate 73 by screws 195. The tool change assembly is also mounted to the mounting plate 73 with screws through screw holes 76 and 77 on either end of the mounts 80 and 81 respectively. Detailed description of the U shaped slide mount 74 and the slide bar 75 is omitted as these are commercially available units. This permits the mounting plate 73 to be translated in the U direction by movement of the lead screw bracket 70 and in the V direction by movement of the lead screw bracket 29. The entire tool change assembly is carried along with the mounting plate 73 and can be positioned at selected U-V positions as is well known including the tool change position which is accessible by the spindle 2.

Alternate Tool Change Device

There are two embodiments of the tool change device. One permits changing tools with a positioning collar and one permits changing tools without a positioning collar. The structure for tools with collars has been described previously and utilizes collets known in the art.

Figure 4B:
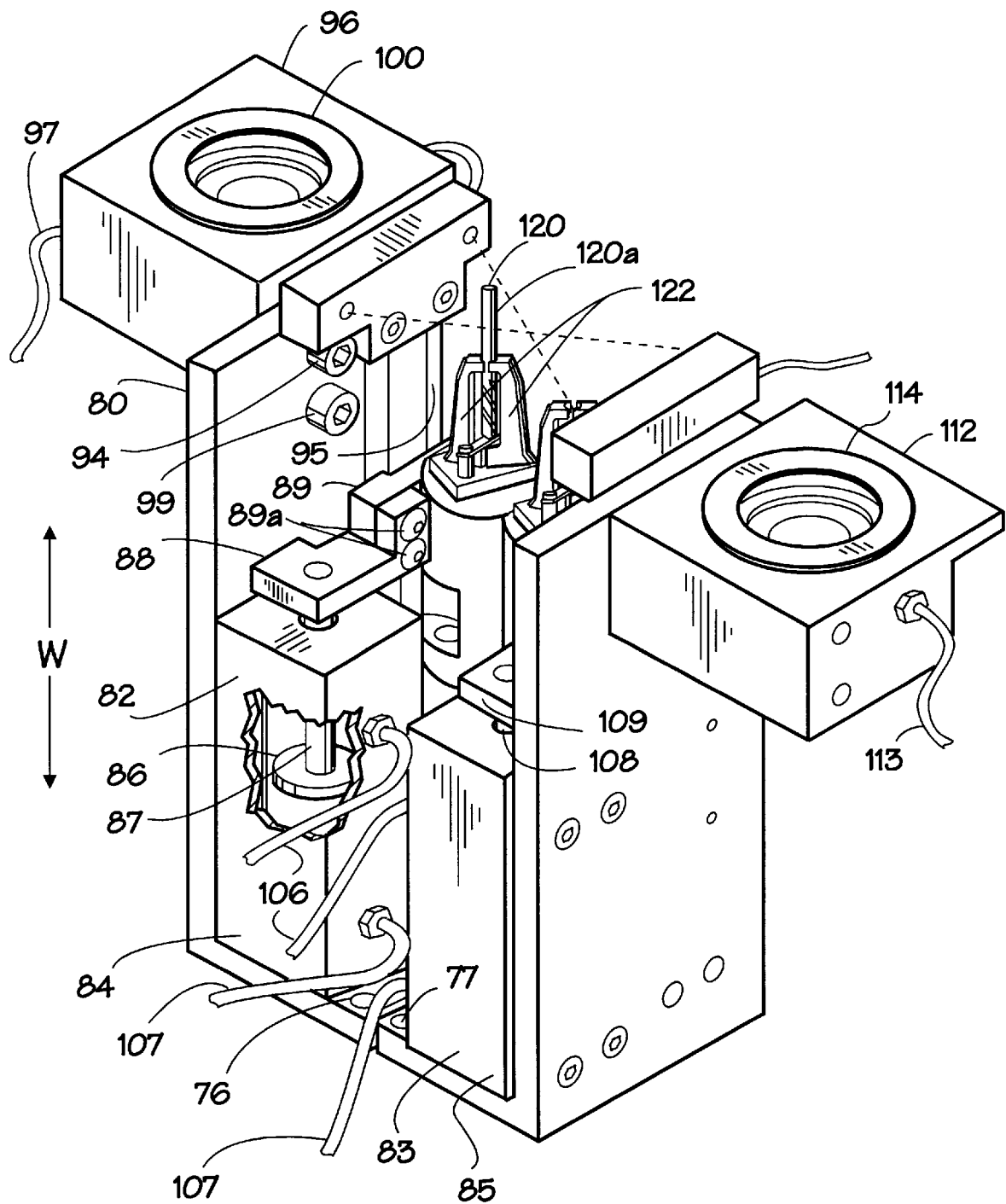
FIG. 4B is a perspective view of the tool change assembly utilizing gripper transfer mechanisms.

The alterative embodiment of the tool changer as shown in FIG. 4B is used for a tool 120, not equipped with a positioning collar and does not use collets. This embodiment uses two transfer gripper assemblies one for load and one for unload. Referring to FIGS. 6A, 6B, 6C and 6D, when in operation, the gripper arms 122 close around the shank 120a of the tool 120 and the gripper 121 either extracts the tool 120 or inserts the tool 120 into the collet of the spindle 2 or tool storage magazine 50, as the case may be.

When the tool change operation transfers tools without collars, the tool change sequence is essentially the same as with collets. However, when tools with collars are used, the collar is set a precise distance (typically 0.800"+0.005") from the tip of the drill. This is true when the drill is new and after it has been resharpened where the collar is repositioned to meet these specifications. When the tool with a collar is inserted into the machine spindle 2, the collar is pushed up against the spindle 2 and the position of the drill tip projects a known distance from the end of the spindle 2 and the machine can be operated immediately and efficiently without coarse compensation for change in tip locations.

The tool change mechanism of the instant invention used with tools without collars is structurally different from that used for tools with collars. As shown in FIG. 4B, instead of transfer collets the tool changer uses two mechanical grippers 121 which are pneumatically opened and closed to grip the tool. As shown in FIG. 6A, each of the gripper assemblies 121 comprises a pair of arms 122 each having a Jaws 122a which are adapted for gripping the tool 120 on either side thereof and securely holding said tool 120. Each of the gripper assemblies 121 is also provided with a tool axial adjustment pad 123 which is mounted on a support 124 mounted to the housing of the gripper assembly 121 such that the axial adjustment pad is disposed between the arms 122 but not attached to either of the arms 122. The axial adjustment pad 123 is positioned a known distance from the top of the gripper Jaws 122a. The computer uses this distance to determine the approximate location of the tip of the tool for coarse adjustment. Thereafter when the tool 120 is inserted into the collet of the spindle 2 it does not require further gross adjustment to allow it to operate efficiently. The length compensation factor computed by the computer based on tool 120 tip position is the only factor which need be determined before machining is initiated. The axial adjustment pad 123 is mounted on a support 124 in cantilevered fashion as shown in FIG. 6A for maximum flexibility, or may, in the alternative, be supported on either side thereof for intermediate flexibility or by a solid support underneath.

When the load transfer gripper 121 has grasped the tool 120 and extracted it from the cartridge or cassette and away from the magazine 50. The gripper arms 122 are opened a very small, precise amount (approximately 0.005") sufficient to loosen the grip on the tool 120. This allows the tool 120 to fall under its own weight a small distance within the transfer gripper 121 onto the axial adjustment pad 123 which absorbs the shock of the drop and axially positions the tool 120 and the griper arms 122 are closed. This positions the tool tip a known distance from the head of the gripper and constitutes the coarse adjustment.

The axial adjustment pad 123 comprises an resilient, pliable pad preferably made of polyurethane. In the current embodiment a polyurethane pad having dimensions of approximately the 3/16" wide 3/4" long and 1/16"" thick is used. Polyurethane material having a SHORE hardness of 95A DUROMETER is preferred although virtually any material which is sufficiently hard and provides extended wear without damaging the tool is acceptable.

In order to provide the above adjustment capability a double action piston is required. FIGS. 6B, 6C, and 6D show the detail of the double piston which activates the gripper 121. In FIG. 6B, the gripper is shown in the fully closed position. A pair of elongated arms 122 are disposed apart from one another and adapted for rotation about a pivot point 121a centrally located on said arms 122. The pivot point 121a is attached to the upper end of housing 121. The upper portion of said arms each have jaws 122a for gripping the shank of a tool 120. The lower end of said arm has a curved edge 150 which is adapted for engaging a plunger 151. The plunger is an elongated cylinder having two sections. The lower section of the plunger 151 has an elongated central cylindrical hole 152 in the bottom thereof and has a tapered section 153 which transitions to a smaller cylindrical section 154 at the top thereof. The top of the plunger is rounded to permit insertion between the bottoms of said arms 122. The plunger 151 is translated upward until the tapered section 153 engages the curved edge 150 of each of the arms 122 and forces the lower section of the arms apart. This causes the arms 122 to rotate about the pivot points 121a which causes the jaws 122a of the upper portion of the arms 122 to move toward each other and grasp any tool which is positioned between said jaws 122a and the arms are in the closed position. This places the gripper 121 in the closed position. In FIG. 6C, the gripper is in the axial adjustment position. The plunger 151 has been translated upward a selected distance and the curved edges of the bottom of said arms 122 are forced apart a selected distance due to the introduction of the smaller cylindrical section 154 between the lower sections of said arms 122. This opens the jaws a small amount sufficient to release the shank of the tool 120 and permits the tool 120 to fall of its own weight in the jaws 122a of the gripper 121 to the pad 123.

In FIG. 6D, the jaws are in the fully open position. The plunger 151 is in its lowest position and is not positioned between the bottom portion of the arms. This allows the spring 155 to fully open the jaws 122a to accept any tool 120 including those with collars as required.

A first piston 157 is mounted to the bottom of the plunger 151 and is integral therewith. The plunger 151 moves through a seal 158 which encloses a first inner chamber 159 and said first piston 157 is adapted to move up and down said first inner chamber 159. A first pneumatic port 160 is provided at the top of the first inner chamber 159 and positioned at least in part above said first piston and disposed between said seal 158 and said first piston 157. A second piston 163 is larger in diameter than the first and has an elongated push rod 164 which is received by the cylindrical hole 152 of the plunger 151. Said second piston 163 is adapted to move up and down a second inner chamber 165 and has a boss on the bottom which spaces it apart from the bottom of the second chamber to allow air pressure to enter under said piston 163 though a port in said chamber 165.

Said second chamber 165 has a second pneumatic port 161 which is disposed at the top thereof below said first piston 157 and above said second piston 163. Said second chamber has a third pneumatic port 162 disposed at the bottom thereof below said second piston 163.

In FIG. 6D, removal of air pressure from pneumatic port 161 and pneumatic port 162 and introduction of air pressure to input port 160 forces piston 157 downward to its lowest position and removes the plunger from between the arms 122 and the jaws of the gripper are disposed in the open position.

In FIG. 6C, removal of air pressure from port 161 and applied to port 160 and port 162 causes the second piston to be forced upward which causes the push rod 164 to move the plunger upward. The first piston 157 is smaller in diameter than the second and therefore the downward force on the first piston 157 forces the plunger in a downward position but permits the second piston 163 to move the entire structure upward. The length of the push rod 164 and the depth of the cylindrical hole 152 are such that the smaller cylindrical portion 154 of the plunger 151 contacts the arms 122 and opens the jaws 122a into the adjustment position.

In FIG. 6B, removal of air pressure from port 160 and port 162 and application thereof to port 161, forces the second piston 163 downward and the first piston 157 upward which drives the plunger 151 beyond the smaller cylindrical area and engages the tapered section 153 with the arms 122. This forces the jaws 122a closed and grips the tool 120 with a force related to the pressure applied to the first piston 157.

Computer control of pneumatic cylinders and electrically operated switches is well known and detailed description thereof has been omitted.

The relative dimensions of the double action piston are such that the above operations are accomplished. In the current embodiment, the ratio of the depth of the cylindrical hole 152 to the length of the push rod 164 is 0.622 to 1.

Figure 6E:
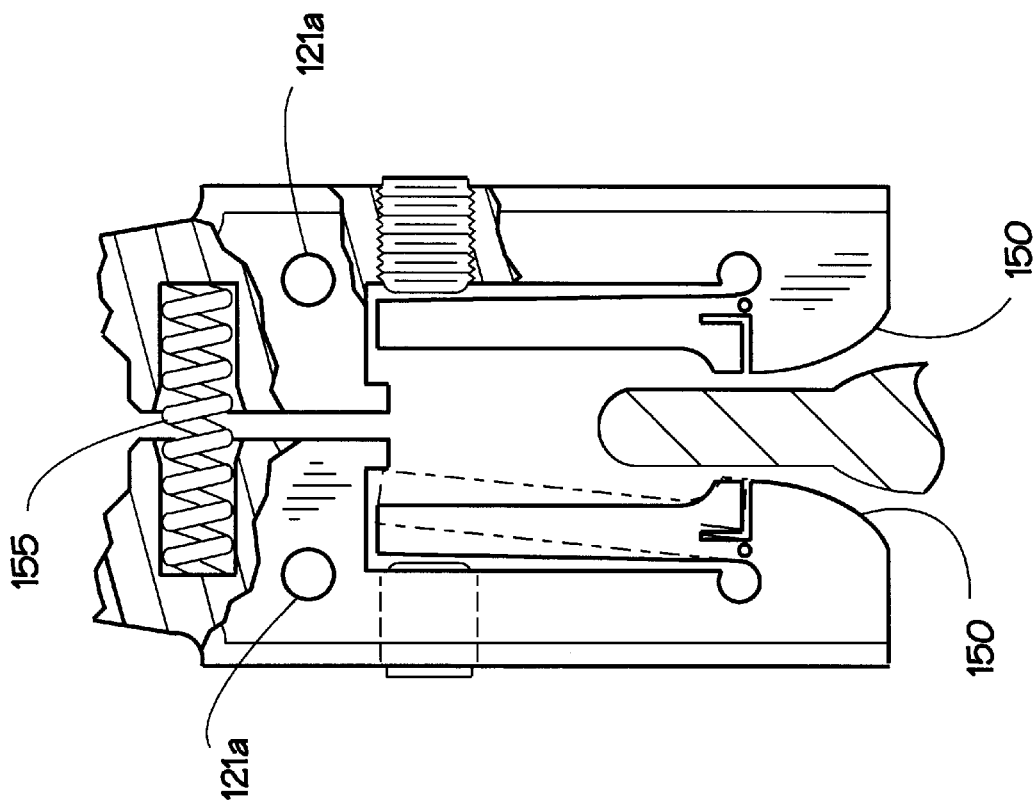
FIG. 6E is a sectional view of the adjustment mechanism for adjustment of the axial adjustment position.
Figure 6A:
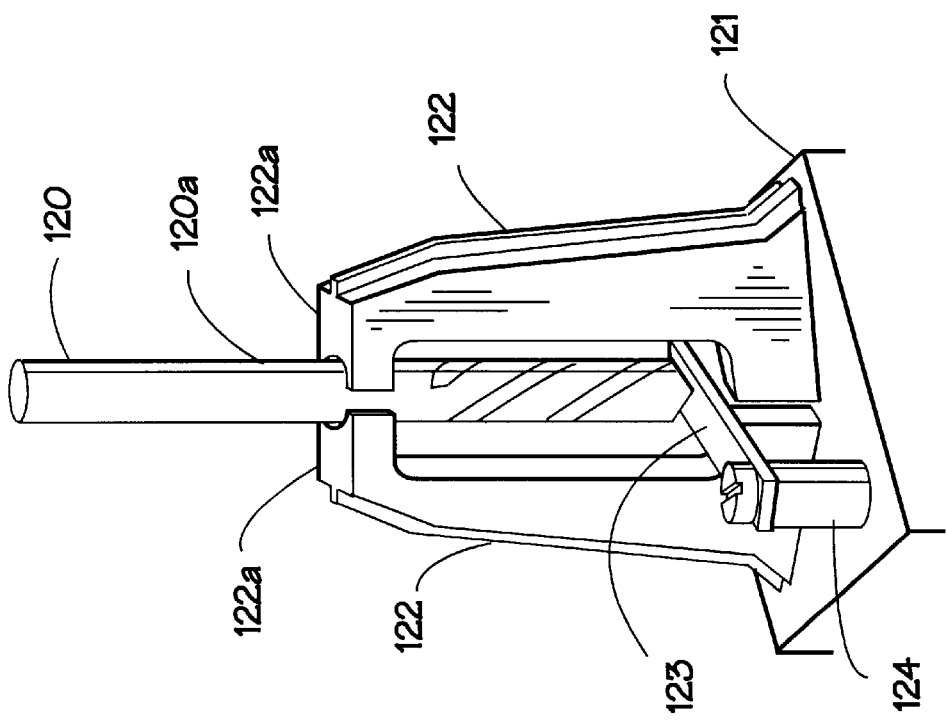
FIG. 6A is a perspective view of the top of the gripper assembly showing a tool aligned on the axial adjustment pad.
Figure 6D:
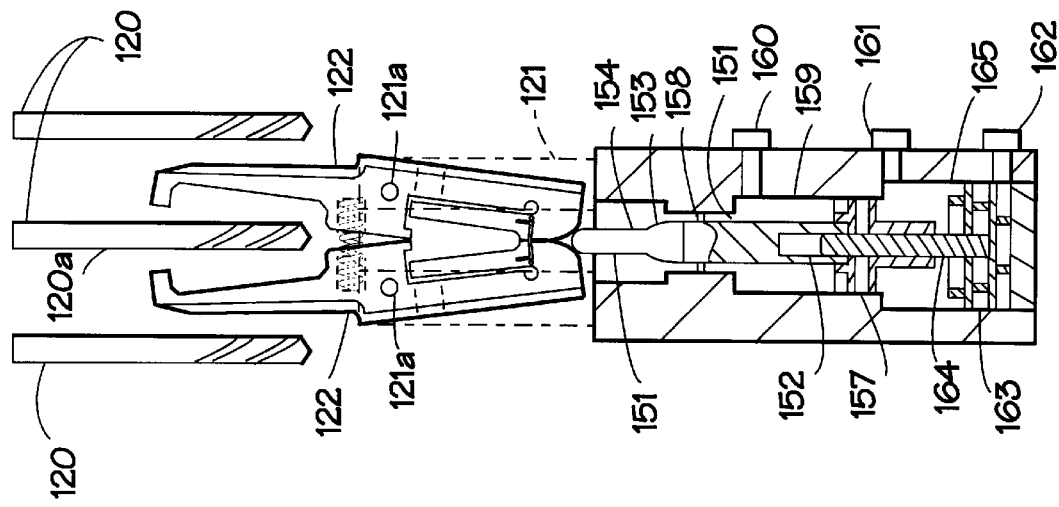
FIG. 6D is a sectional view of the gripper assembly in the open position.
Figure 6C:
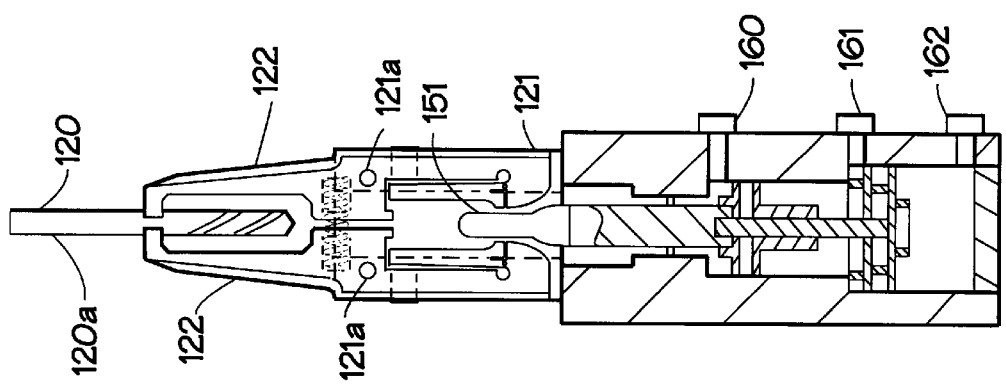
FIG. 6C is a sectional view of the gripper assembly in the axial adjustment position.
Figure 6B:
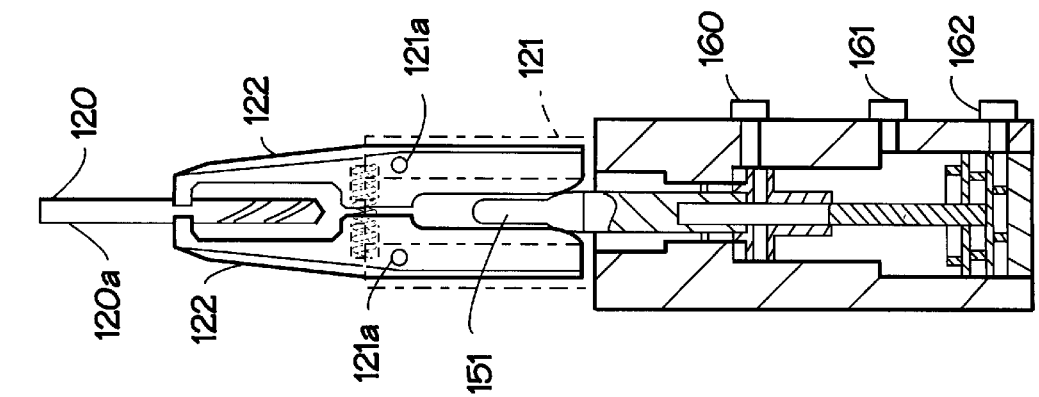
FIGS. 6B & 6F are sectional views of the gripper assembly in the closed position.
Figure 6F:
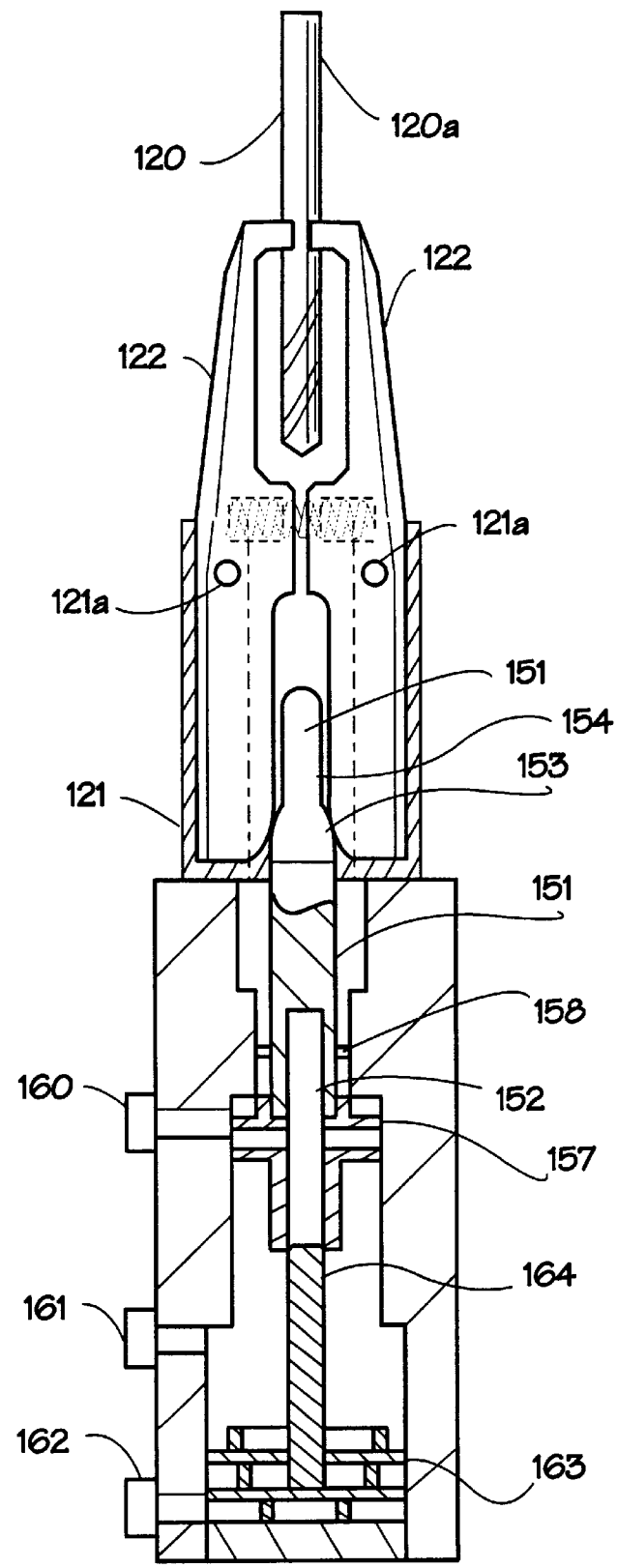

FIG. 6F is a close up sectional view of the double piston gripper showing a boss at the bottom of the piston 163 FIG. 6E shows the adjustment configuration of the lower portions of arms 122. The lower section of the arms below the pivot point 121a are provided with a set screw 170 which is mounted through the outer portion of the arm 122 through screw threads 171 and is axially adjustable. The set screw 170 contacts a flexible section 172 of the arm 122 generally in the form of a boot which is attached to the lower portion of the arm 122 opposite the curved section 150 thereof. The lower portion of the arm 122 has a horizontal slot 173 therein which extends into but not through the lower portion of the arm 122 and communicates with a vertical slot 174 which extends upwards but not through the length of the lower portion of the arm 122. Above the flexible section a second horizontal slot 175 extends inwardly of the arm 122 and is longer than the first horizontal slot 173 and communicates with a second vertical slot 176 extending downward to a hole 177. This forms the flexible section 172 which resembles a boot and is permitted to pivot through a flex point 178. On the inner side of the flex portion of the arm at the bottom is a tab 179 which in the unflexed position protrudes inwardly the same distance as the innermost section of the curved portion 150. When the set screw 170 is turned down against the upper end of the flexible section 172, the flex portion is deformed inwardly toward the center of the housing and the tab 179 engages the smaller cylindrical section of the plunger. This allows adjustment of the degree with which the plunger can open the jaws during the axial adjustment operation. The current dimensions of the structure has an adjustment for a stroke of the set screw position of 0.0540 inches which results in an adjustment of the tab position of 0.0035 inches based on the current dimensions of the arms and results in a very fine adjustment. A change in the dimensions of the structure can result in greater or lesser sensitivity to such adjustment. A second tab 180 protrudes from the base of the arm 122 at the second horizontal slot and acts as a stop to prevent over adjustment of the set screw.

A spring 155 is shown disposed above the pivot point 121a and acts to bias the jaws in an open position and against the action of the plunger.

Tool Storage Magazine

The tool storage magazine 50, as shown in FIG. 1, comprises, but is not necessarily limited to, an eight sided tool storage magazine 50 adapted for receiving a tool cartridge 140 or cassette cartridge 128. Not shown are the drum rotation system, drum location feedback encoder all of which are controlled by the controller or computer of the machine tool and the mounting column and protective cover and which are known in the art.

Figure 8B:
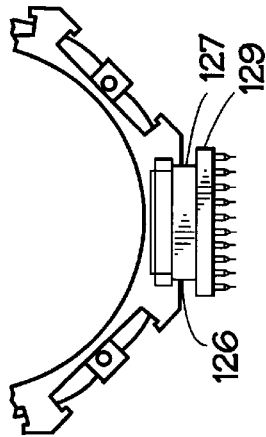
FIG. 8B is an end view of the magazine holding the cartridge which receives the EURO cassettes.
Figure 8A:
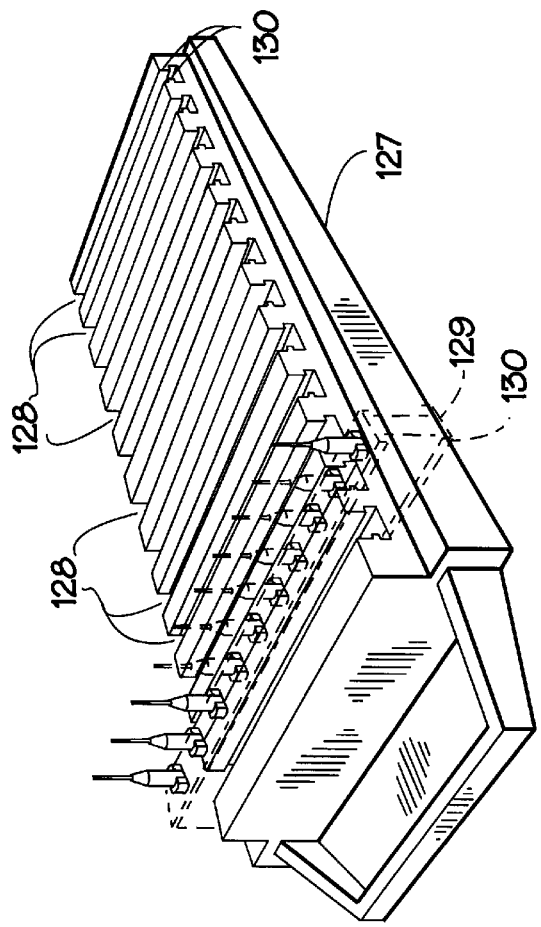
FIG. 8A is a perspective view of the cartridge holder having a plurality of slots for receiving EURO cassettes having tools.
Figure 7A:
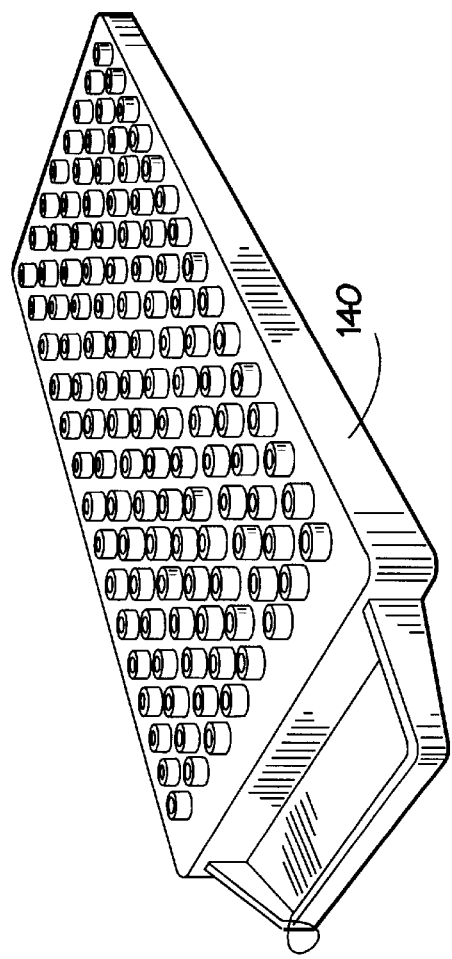
FIG. 7A is a perspective view of the cartridge holder having a plurality of holes for receiving tools.
Figure 7B:
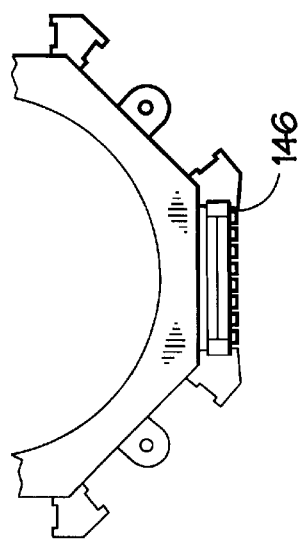
FIG. 7B is an end view of the magazine holding the cartridge with holes.

The tool cassette holder 140, as shown in FIG. 7A, is a removable unit which slides into a pocket or slot 146 in the tool storage magazine 50. It is one piece construction holding as many as 120 tools as shown in FIG. 7A. In operation tools are loaded into the holes in the cartridge 140 and the cartridge inserted into the slot 146 or the magazine 50. This a laborious and time consuming process. FIG. 8A shows a new cartridge design which accepts the EURO cassette which is typically how the tools are distributed. The EURO cassette 129 has a row of longitudinally spaced holes above its length and holds 11 tools. The new cartridge 127 has a has a plurality of transverse slots 128 adapted to hold multiple EURO tool cassettes as shown in FIG. 8A without the necessity of removing such tools and placing them in the older style cartridge tool holder. FIGS. 7B and 8B show the slightly different magazine structure for receiving the different style cartridges. FIG. 8A shows the mounting of the EURO cassettes and FIG. 7B shows the mounting of the one piece cassette. Appropriate adjustments need to be made in the design of the magazine 50 to account for the differences in positioning of the tools. While in each case, the tools are oriented such that the tips project out and away from the magazine 50 so they can easily be removed by the tool changer, the cartridge holding the EURO cassettes causes the tools to project slightly farther from the slot 126 due to the fact that the cassettes are positioned below the surface of the slot of the magazine 50.

FIG. 7A shows the cartridge 140 for the tool magazine which has a plurality of holes 141 for insertion of tools. FIG. 7B shows the slot 146 in the tool magazine which receives the cartridge 140.

FIG. 8A shows the cartridge 127 which has a plurality of transverse slots 128 along its longitudinal axis. Each of the slots has a notch 130 in the bottom of said slot 128 on opposite sides thereof. Said slots 128 are adapted to slideably receive the EURO cassettes 129 with tools mounted therein. Rather than removing each tool from the EURO cassette, the tools may be left in such cassettes and the cassettes inserted into the slot 128 of the cartridge for insertion in the tool magazine. As noted in FIG. 8B the slot in the tool magazine is slightly altered in that the cartridge 127 extends below the surface of the magazine 50 slot 126 to permit the EURO cartridge to clear the surface of the magazine slot 126.

Tool Change Cycle Steps

In existing machines, where the spindle 2 is designed to move only within the boundaries of the work table 5, the work table must be positioned away from the spindle and the tool change assembly and held in such position until the tool change has taken place. However, where spindle 2 motion along the X axis exceeds the boundaries of the work table the spindle 2 can be positioned over a tool change location which is beyond the boundary of the work table and the tool change can take place even while the work table is being positioned for the next operation.

The tool change cycle for machine tools which have spindle's which are bound to the X axis of the work table is shown in the flow charts of FIGS. 9A through 9K.

Figure 9A:
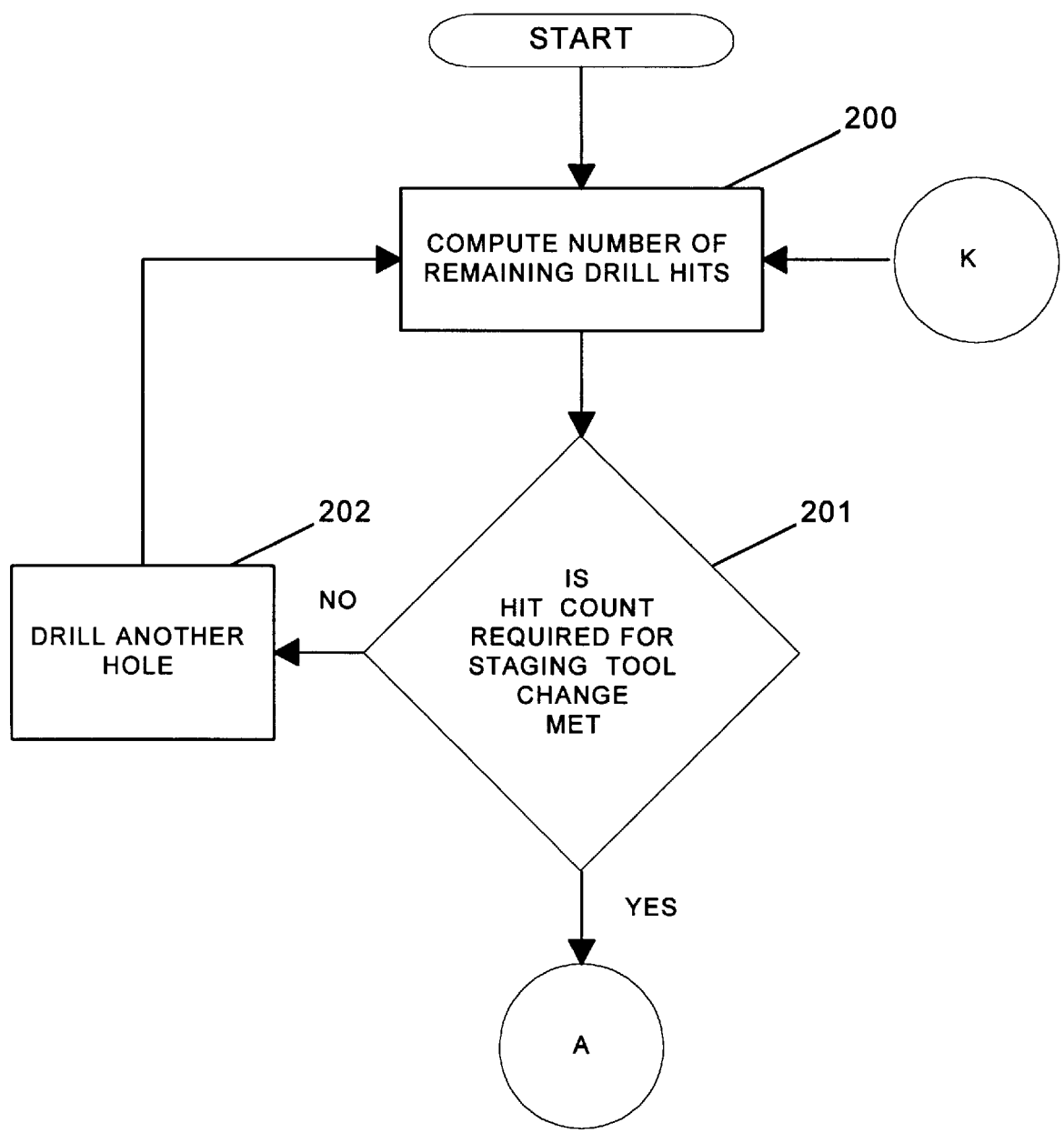
Figure 9B:
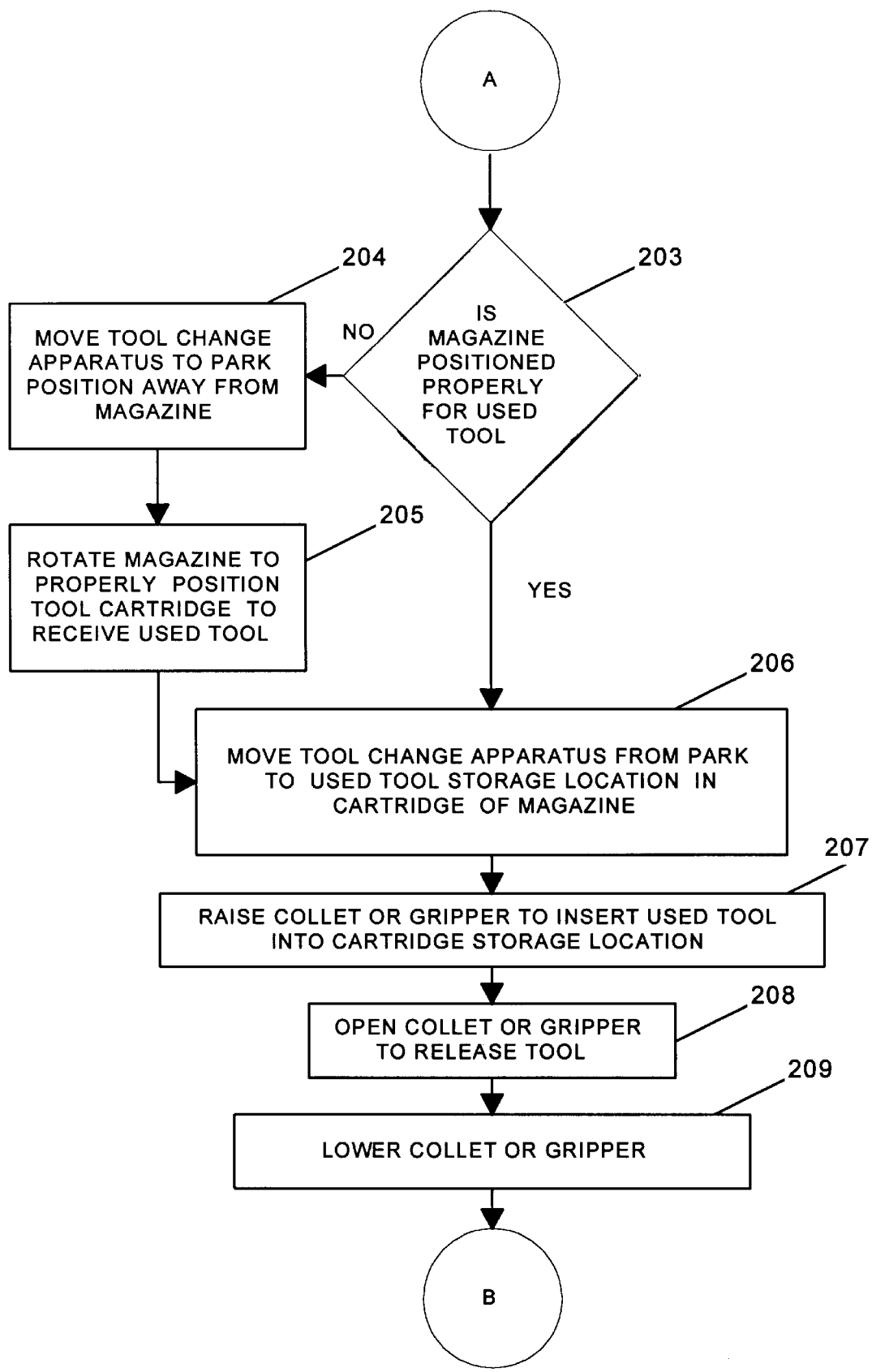
Figure 9C:
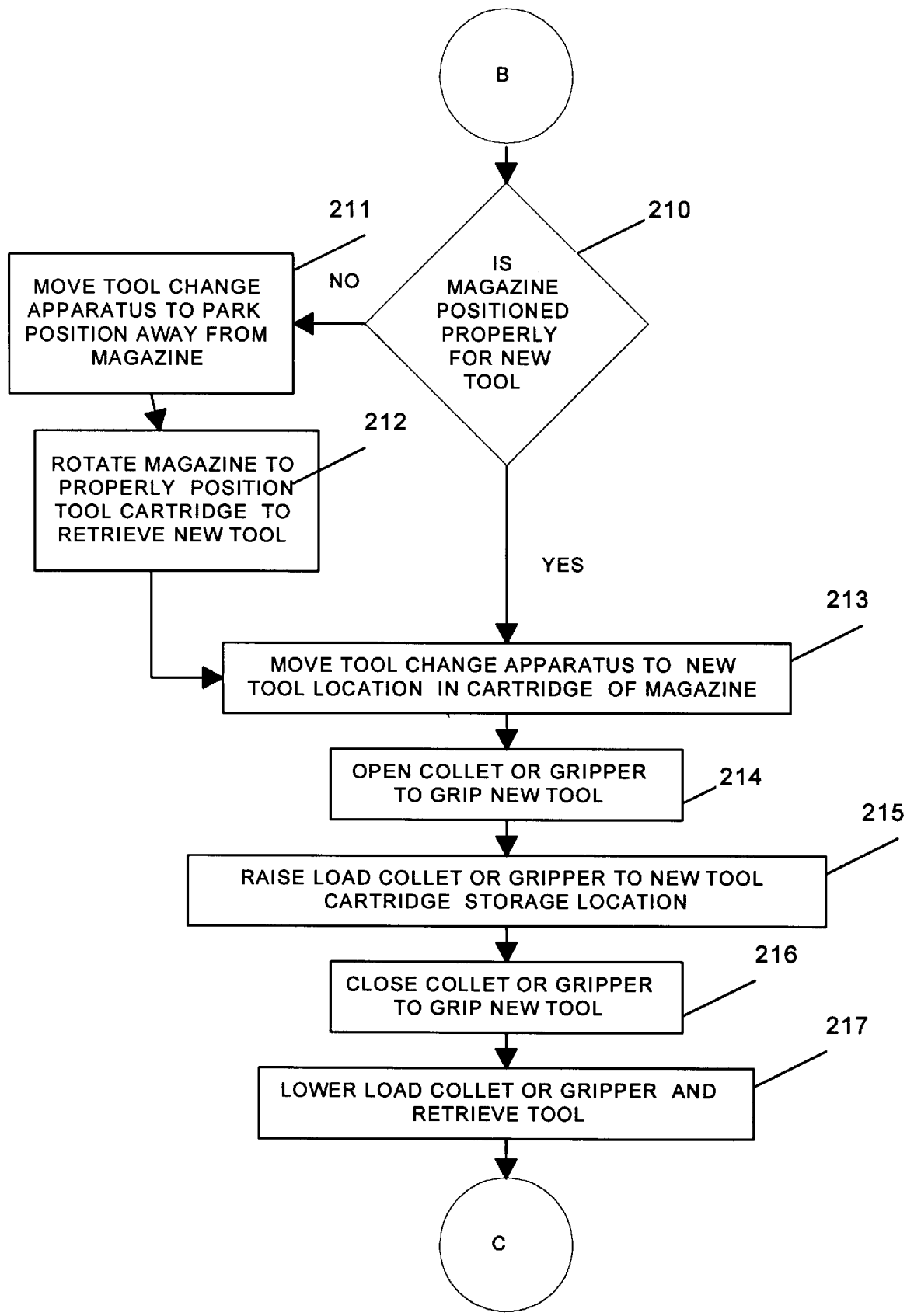
Figure 9D:
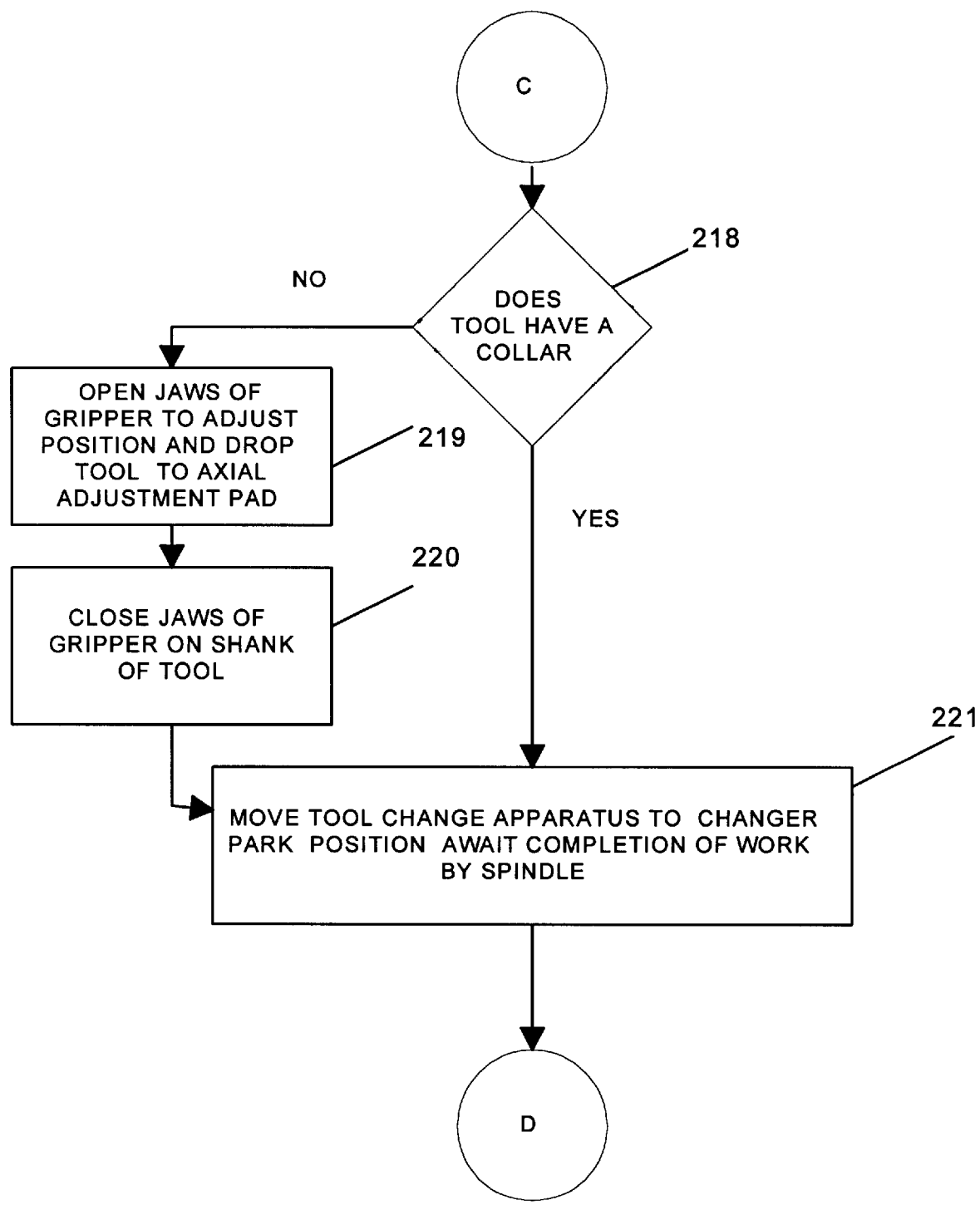
Figure 9E:
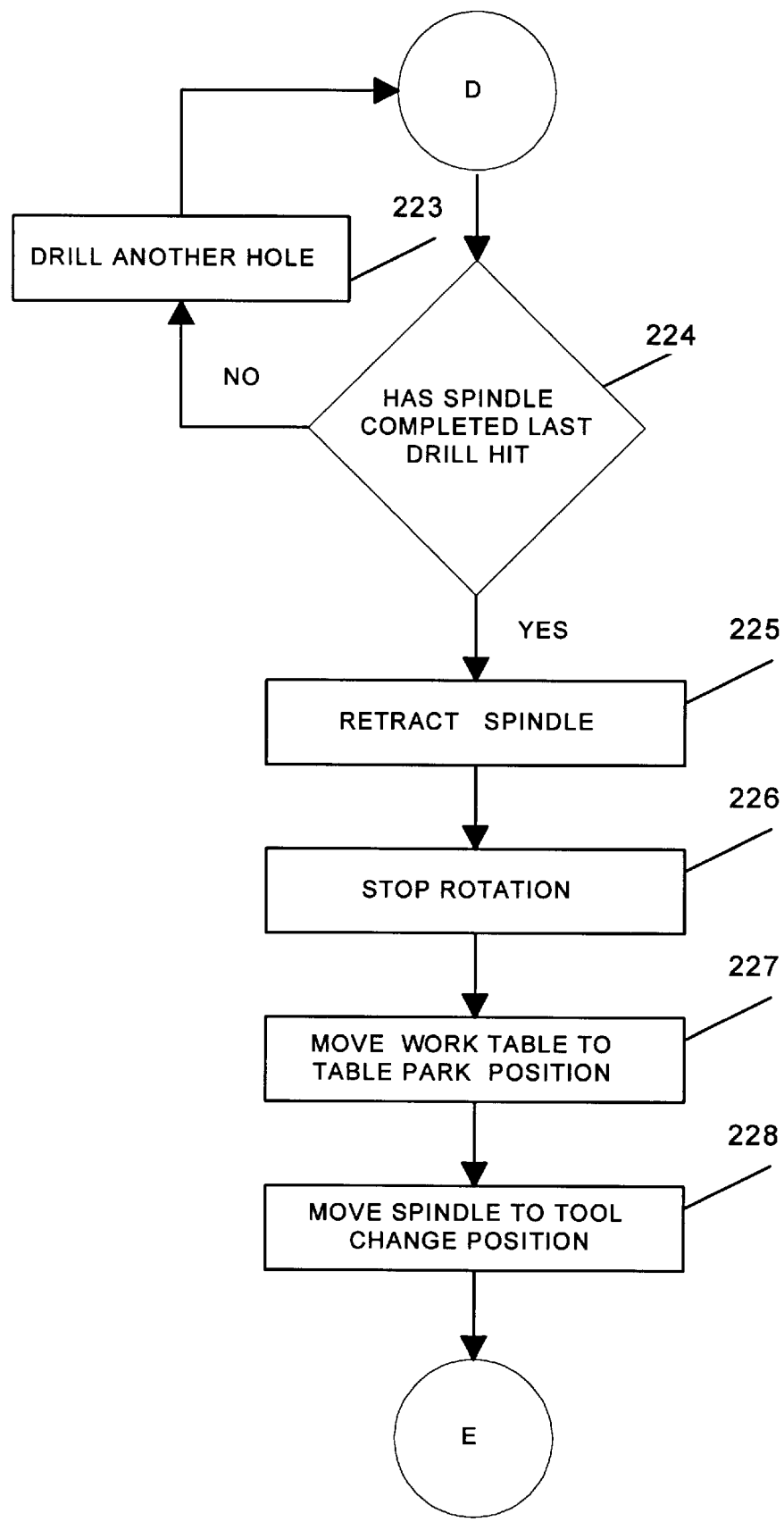
Figure 9F:
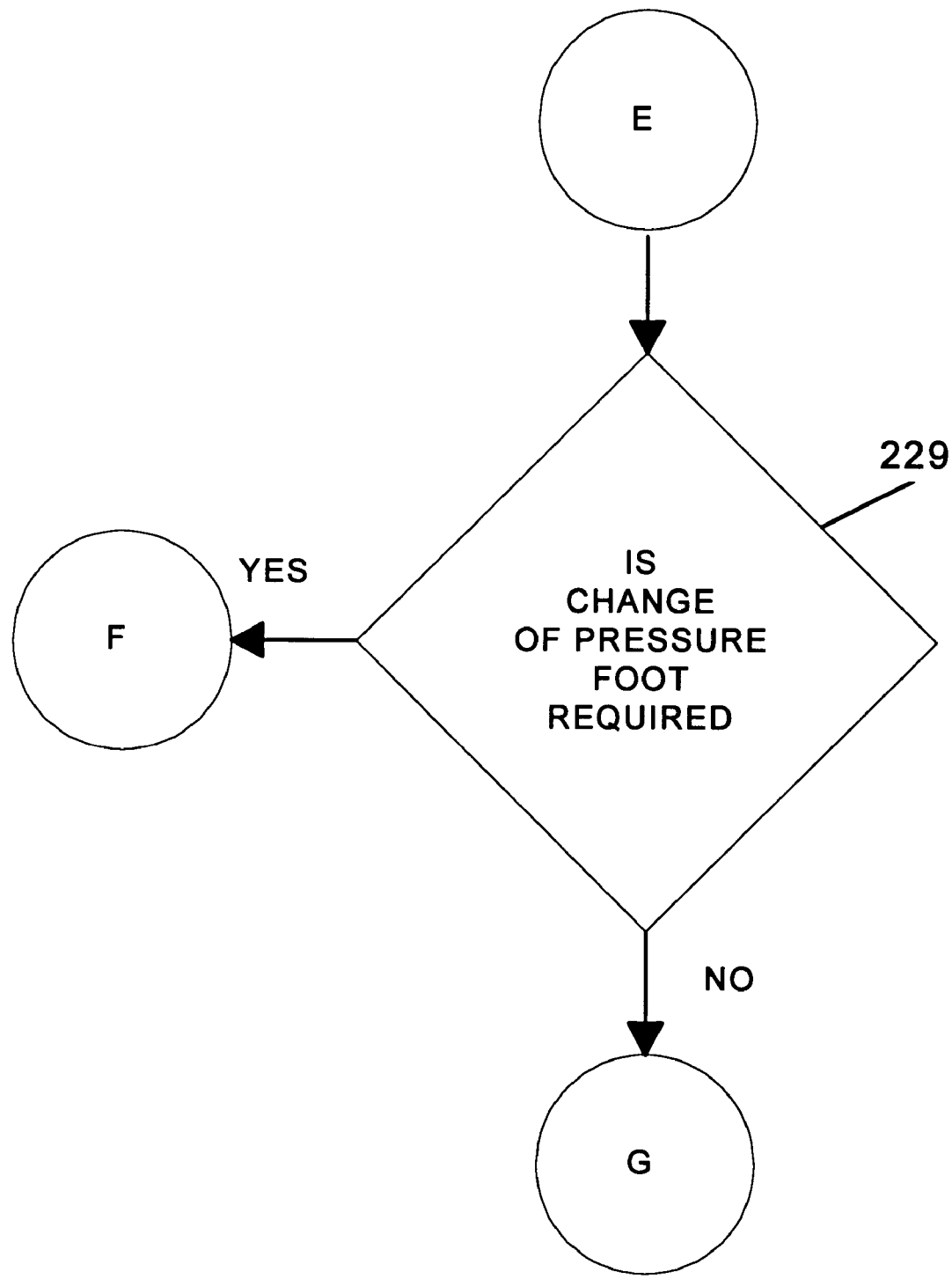
Figure 9G:
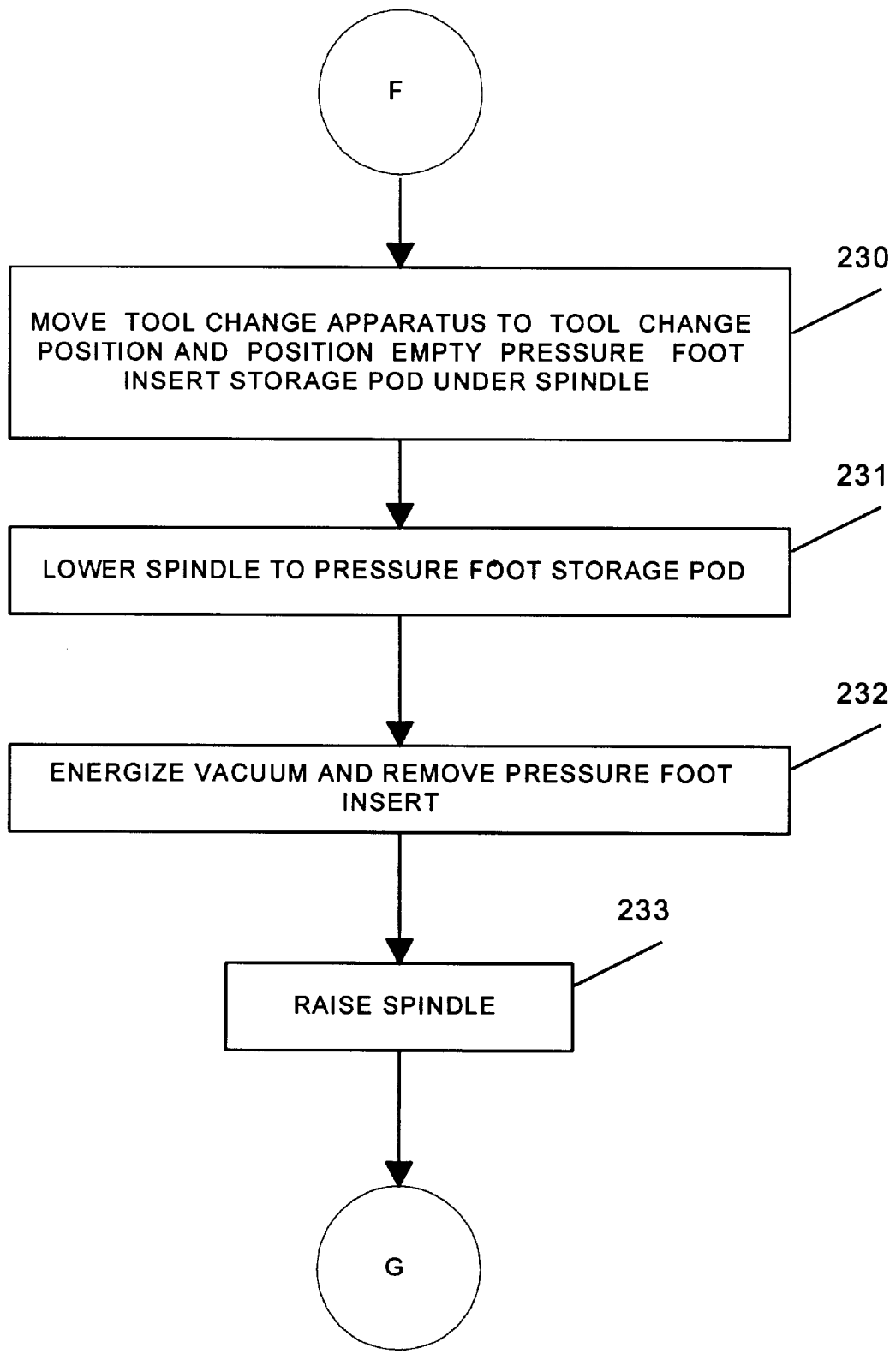

While the computer is operating the machine it will continually compute the number of drilling operations remaining, ie. the hit count, as shown in FIG. 9A step 200. The computer will test for a specified hit count remaining in order to commence the staging of the next tool to be used, step 201. If the hit count has not been met the machine tool will continue drilling with the next hole and the testing will continue. At this time the tool change assembly is parked at a changer park location away from the tool change location and away from the magazine 50 which holds the tools. At a specified number of remaining hit counts, which is set based on the expected time required to stage the tool, the computer will initiate the staging commands for the tool changer to commence staging of the tool which is to be used next. As shown in FIG. 9B, this staging commences with a test to determine if the magazine 50 which holds the cartridge supporting a tool cassette storage location or housing the storage location hole of the previously used tool is properly positioned to receive the previously used tool, step 203. If it is not properly positioned the computer energizes the U and V axis lead screw motors and positions the tool change assembly at a park position away from the magazine 50 and the tool change position to ensure that the tool changer is so positioned, step 204. The computer then energizes a switch which energizes the magazine rotation motor and the magazine is rotated until the storage location of the tool is positioned to receive the tool, step 205 as is known in the art. The tool change assembly is then moved, by appropriate positioning of the U and V lead screws under computer command, from the changer park location to the magazine 50 and into an unload position which positions the used tool directly beneath the storage location, step 206. The collet or gripper as the case may be are raised by activation of the pneumatic piston 82 or 83 as the case may be through computer controlled switches and inserts the used tool into the storage location, step 207. Once the tool has been positioned into the storage location, the collet or gripper of the tool change assembly is opened and the tool is released, step 208. The cartridge or the tool cassette holds the tool with a friction grip in a hole in the cartridge or tool cassette as is know in the art. Pressure on the pneumatic piston 82 or 83 is reversed through computer controlled switches and the collet or gripper assembly is lowered, step 209. FIG. 9C shows the staging of the new tool. The computer tests to determine if the magazine is positioned properly to retrieve the new tool, step 210. If it is not so positioned, the tool change assembly is again moved to the changer park position, step 211, to avoid impact of tools against the top of the changer assembly when the magazine is rotated. The computer then commands the rotation of the magazine as described before to properly position the new tool for removal, step 212. The tool change assembly is then moved to the magazine and the load collet or gripper is positioned under the selected tool, step 213. While the collet or gripper should have remained open since the last operation, it is again commanded to the open position, in step 214. The collet or gripper is thereafter raised by applying pressure to the pneumatic piston 83 or 82 to raise the load collet or gripper assembly in the same manner for the unload transfer as described above, step 215. The load collet or gripper is then closed by action of the lower pneumatic valve and the new tool is securely gripped and held in the tool change assembly step 216. The pressure on the pneumatic piston 83 or 82 is reversed and the collet or gripper with the tool is lowered, step 217. In the case of tools with collars, the collet gripping the tool will have engaged the collar a specified distance from the tip of the tool and coarse positioning will have been achieved and no further adjustment will be required. However, in the case of tools without collars, as described herein, additional steps are required. FIG. 9D shows a test for tools with or without collars step 218. In operation, it is unlikely that tools of different types would be mounted on the same magazine and therefore in any given implementation all of the tools would either have collars or would not. Therefore, while FIG. 9D shows a specific test for the type of tool, two separate implementations of the steps in the computer program, are implemented as shown in FIG. 9D1 and FIG. 9D2. In the case of tools with collars FIGS. 9D and 9D1 there is no need to make any further adjustment of the tool and the Tool change assembly is moved to the changer park position immediately to await completion of the work by the spindle and the staging process has been completed, step 221. In the case of tools without collars, FIGS. 9D and 9D2, a special gripper assembly having the axial adjustment pad as previously described are mounted on the tool change assembly. The tool gripper would be activated by the computer to set the jaws of the gripper to a tool adjust position and the tool would be allowed to fall to the axial adjustment pad, step 219. This provides a course adjustment of the axial position of the tool and the jaws of the gripper would then be closed on the shank of the tool, step 220. Thereafter the tool change assembly is moved to the changer park position to await completion of the work by the spindle and the staging process has been completed, step 221.

Figure 9H:
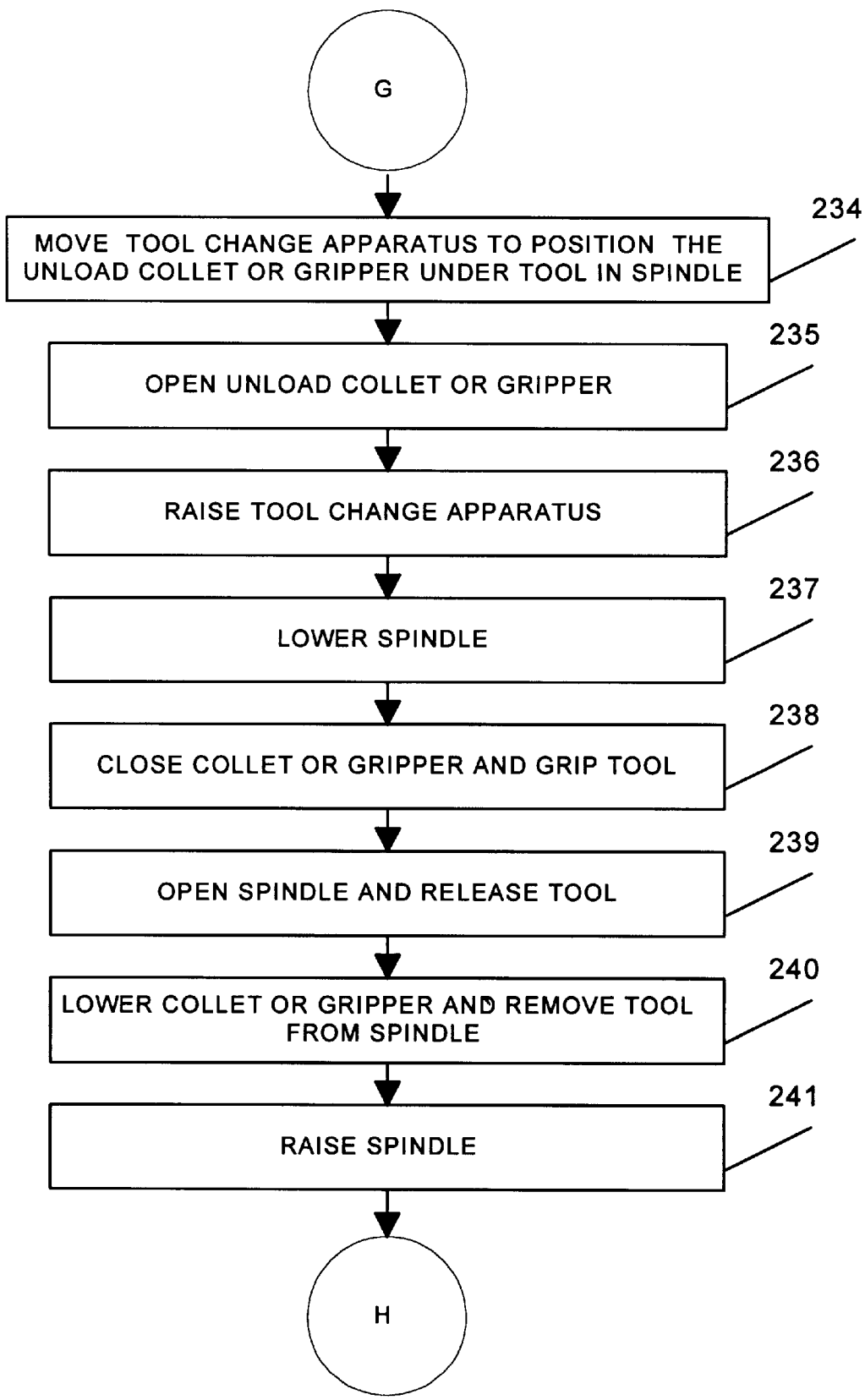
Figure 91:
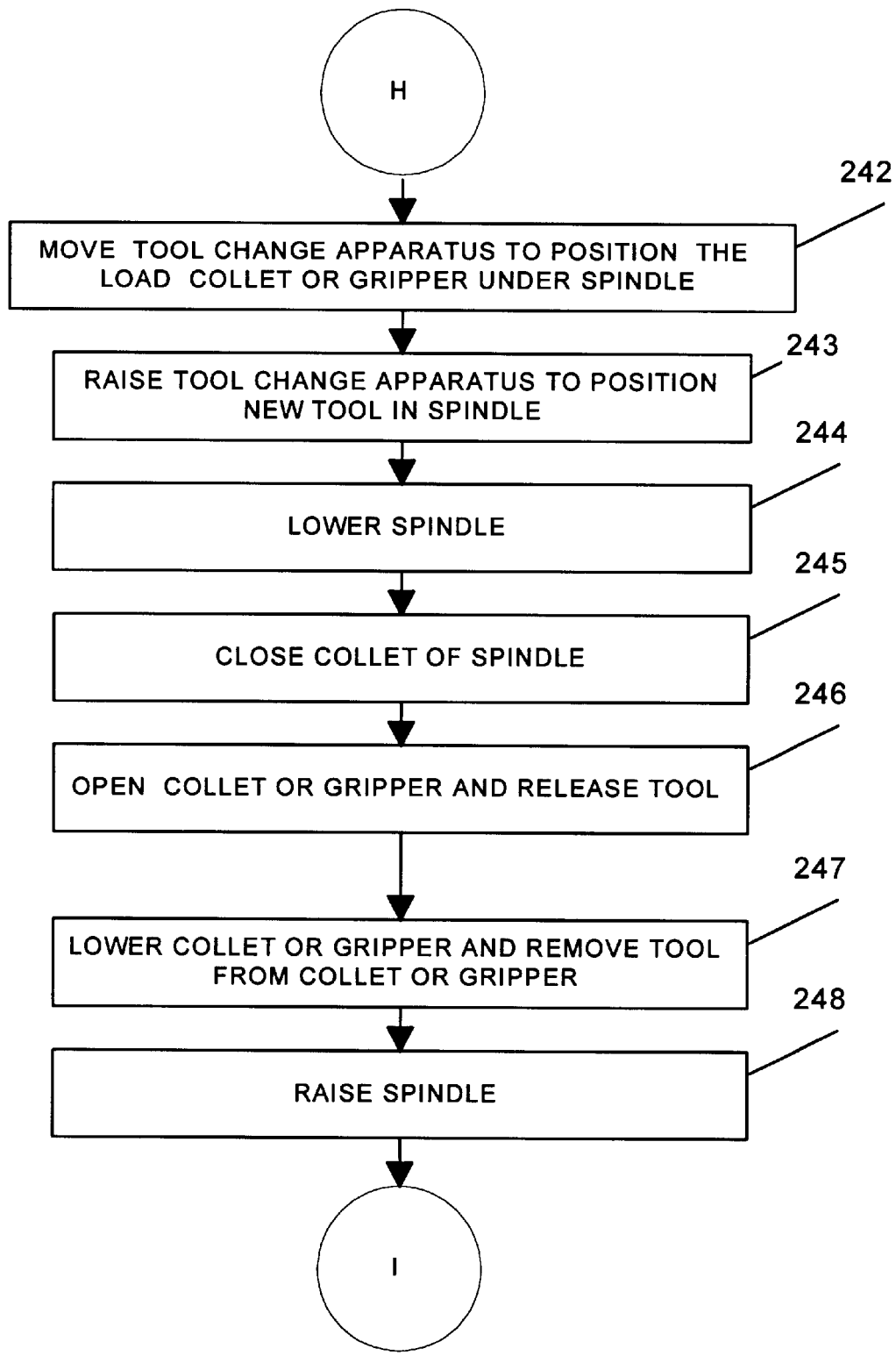
Figure 9J:
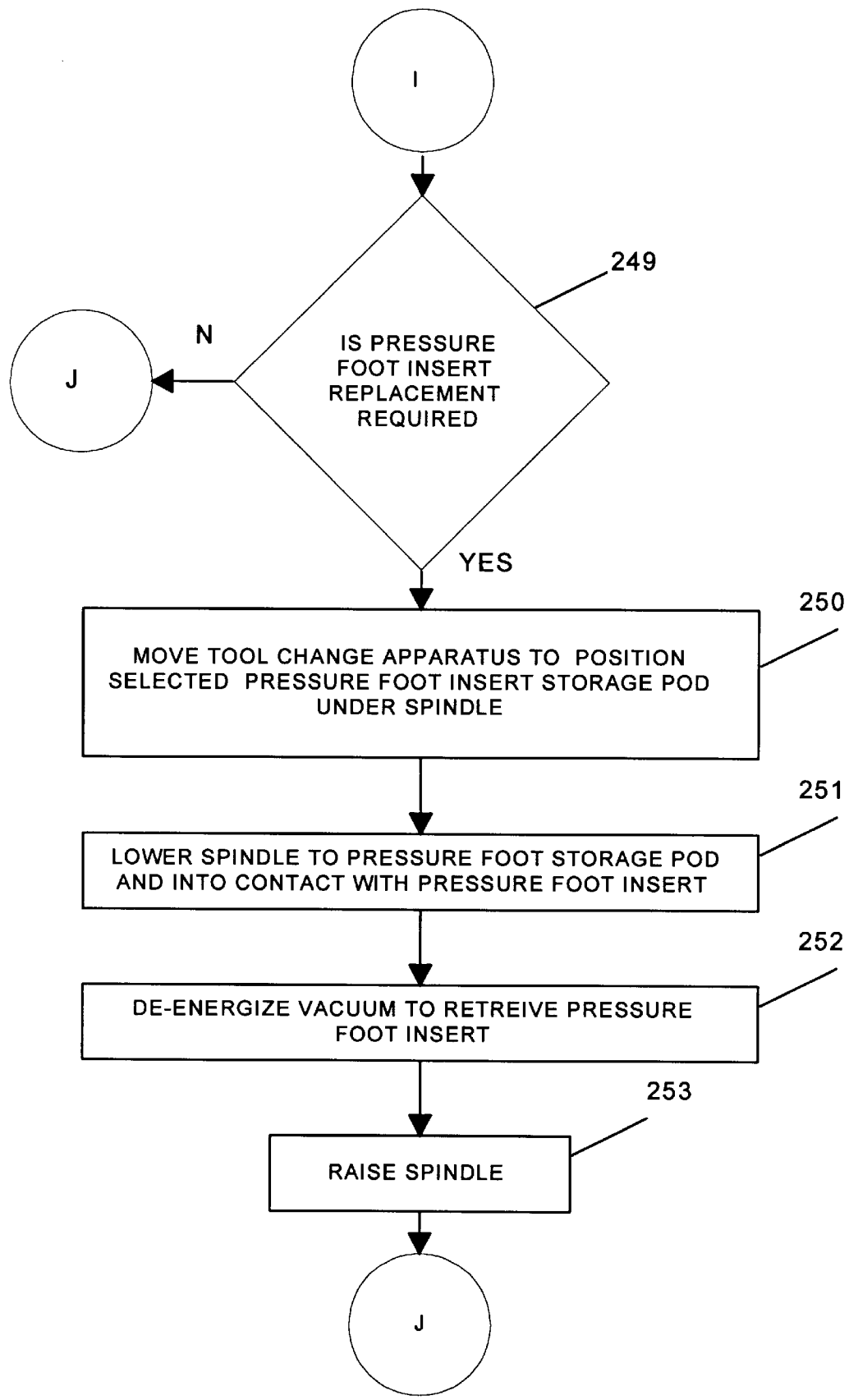
Figure 9K:
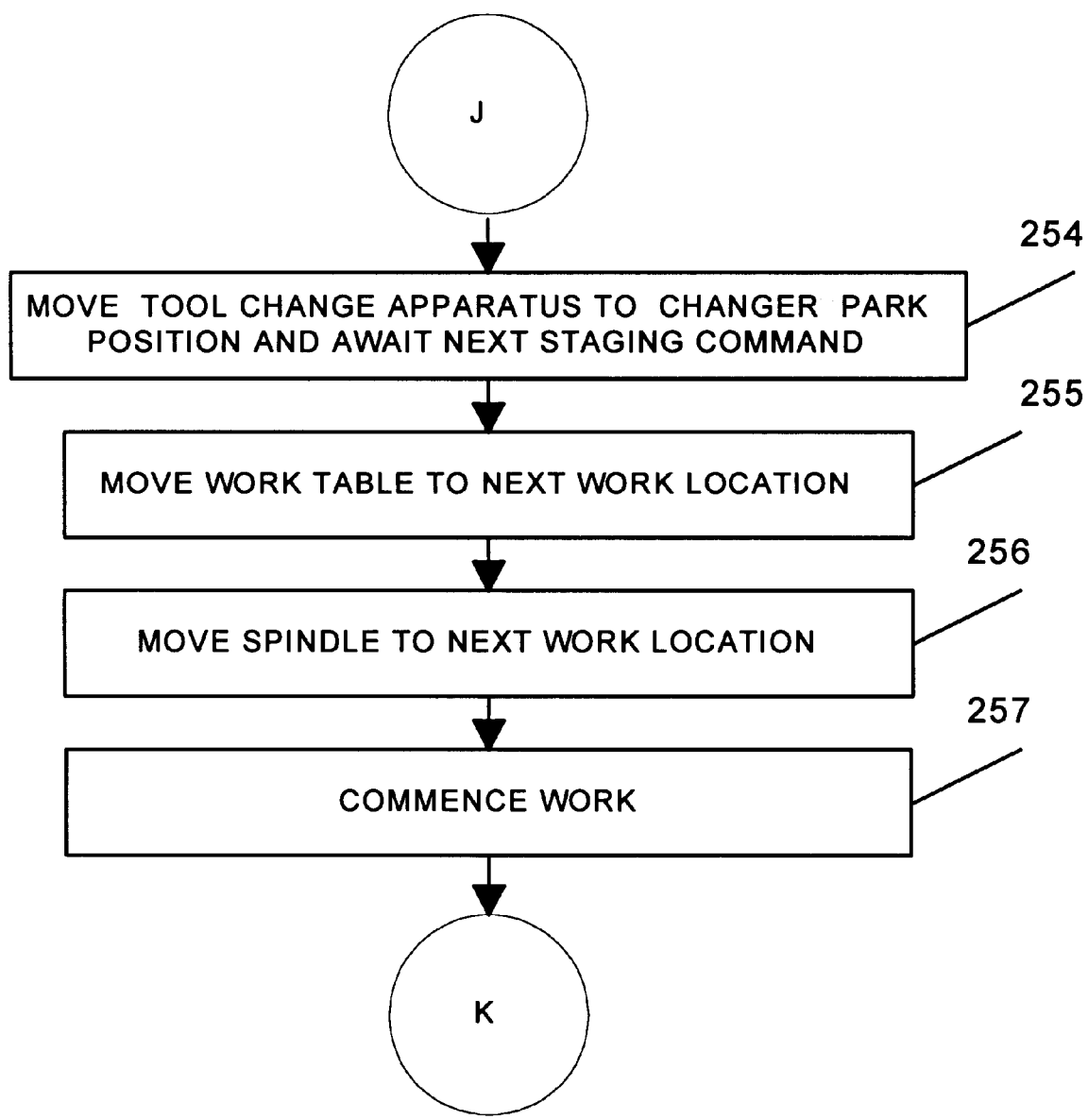

After staging has been completed, The computer checks to determine if the last drill hit has been completed, step 224. If it has not the work continues step 223. When the last drill hit has occurred, the tool change cycle is commenced. The spindle is retracted, step 225 and rotation is stopped, 226. In the current embodiment, which utilizes existing machine tool designs, the work table is moved to a table park position, step 227 in order to position it out of the way of the tool changer so the tool changer can be moved to the tool change position accessible by the spindle. In the case of new designs, the tool change position may be located out of the way of the work table, by increasing the X travel distance of the spindle past the edge of the work table and locating the tool change apparatus adjacent to the work table. In such a case the work table need not be moved to a park position but may instead be positioned at the next work location. In the current design the spindle is moved to the tool change position, which is located within the range of motion of the work table 5, step 228. The computer determines if a change of the pressure foot insert is required, step 229. If no change is required, ie. the pressure foot insert opening permits entry of the collet or gripper without removal, the tool change cycle commencing as shown in FIG. H is executed. If a change is required, ie. a new pressure foot insert is required or the tool change cannot take place while the insert is in position, the tool change assembly is moved to the tool change position so that an empty pressure foot insert storage pod is positioned under the spindle, step 230. The spindle is lowered to make contact with the pressure foot insert on the storage pod, step 231. The vacuum source is applied to the pressure foot pod and creates a suction which grips the pressure foot insert on the nose of the spindle, 232. The force generated by the vacuum must be sufficient to overcome the attractive force of the permanent magnets mounted on the pressure foot insert which holds it to the nose of the spindle. The spindle is then raised, step 233 and the tool change cycle continues as shown in FIG. 9H. Referring to FIG. 9H, the tool change assembly is moved to position the unload collet or gripper under the tool in the spindle, step 234. The unload collet or gripper is opened, step 235. The tool change assembly is raised, step 236, to receive the used tool from the spindle. The spindle is lowered, step 237, and the used tool is inserted into the unload collet or gripper. The unload collet or gripper is closed, step 238 and the used tool gripped securely. The spindle is then opened to release the tool, step 239. The unload tool change assembly is then lowered and removes the tool from the spindle, step 240. The spindle is then raised to clear the top of the tool, step 241. In FIG. 9I, the tool change apparatus is then moved to position the load collet or gripper under the spindle, step 242. The load tool change assembly is raised in the same manner as described before to position the new tool in the spindle, step 243. The spindle is then lowered, step 244. The collet of the spindle is closed and grips the tool, step 245. The collet or gripper of the tool change assembly is opened and the tool released, step 246. The tool change assembly is then lowered, step 247 and the spindle raised, step 248 to clear the tool change assembly.

The computer then determines if a pressure foot insert replacement is required, step 249. If no pressure foot insert was removed then it need not be replaced. If the pressure foot insert was removed then two possibilities exist because the tool change assembly includes two pressure foot insert pods one of which holds the removed insert and the other holds a new insert which would typically have a different sized drill hole. The computer selects one of the pods for reinsertion of the insert and moves the tool change apparatus to position the selected pressure foot insert storage pod under the spindle, step 250. The spindle is lowered to the pressure foot storage pod and into contact with the pressure foot insert, step 251. The vacuum in the pod is de-energized and releases the pressure foot insert, 252. This permits the permanent magnets on the pressure foot insert to attach the insert to the nose of the spindle. The spindle is raised, step 253 and the tool change cycle is completed.

The tool change apparatus is moved to position the entire tool change assembly the changer park position to await the next staging command, step 254. The work table is moved to the next work location step 255. The spindle is moved to the next work location, step 256. Work commences, step 257 and the cycle commences again with the computer checking the hit count for staging purposes as shown in FIG. 9A.

The computer programmed steps in the work cycle have been omitted as these are known in the art.

Having thus described the invention what is claimed is:

1. A method for controlling a machine tool including a spindle, a work table and a tool changing apparatus having at least two movable tool grippers each gripper having a multi-action cylinder coupled thereto for movement of said gripper along a central axis of said gripper generally perpendicular to the plane of said work table comprising the steps of:

a. moving said tool changing apparatus from a changer park position to a tool storage location along a path parallel to the plane of said work table during a work cycle of the machine tool to position the central axis of a first tool gripper of said at least two movable tool grippers containing a first used tool such that said axis is in alignment with the tool storage location;

b. energizing at least one of said multi-action cylinders coupled to said first tool gripper to move said first tool gripper containing said first used tool, parallel to said central axis of said first tool gripper and generally perpendicular to said work table, to insert said first used tool into said tool storage location;

c. moving the tool changing apparatus along said path to position the central axis of a second tool gripper of said at least two tool grippers, at a tool retrieve location in alignment with a next tool to be retrieved during the work cycle of said machine tool;

d. retrieving the next tool to be used with said second tool gripper;

e. moving the spindle to a tool change position on completion of the work cycle;

f. moving the tool changing apparatus along said path to position the central axis of said first tool gripper at the tool change position such that said central axis is in alignment with said spindle;

g. energizing at least one of said multi-action cylinders to move said first tool gripper along the central axis of said first tool gripper to grip a second used tool in said spindle;

h. unloading said second used tool from the spindle;

i. moving the tool changing apparatus along said path to position said second tool gripper containing said next tool so that the central axis of said next tool at the tool change position is aligned with the central axis of said spindle;

j. loading the retrieved next tool into the spindle;

k. moving the spindle to a work location to commence a new work cycle;

l. moving the tool changing apparatus to the tool changer park position;

m. moving the tool changing apparatus including a pressure foot insert storage pod to the tool change position during the work cycle of the machine tool prior to unloading the second used tool from the spindle; and n. retrieving a pressure foot insert from said spindle onto said pressure foot insert storage pod prior to unloading the second used tool from the spindle.

2. A method for controlling a machine tool including a spindle, a work table and a tool changing apparatus having at least two movable tool grippers each gripper having a multi-action cylinder coupled thereto for movement of said gripper along a central axis of said gripper generally perpendicular to the plane of said work table comprising the steps of:

a. moving said tool changing apparatus from a changer park position to a tool storage location along a path parallel to the plane of said work table during a work cycle of the machine tool to position the central axis of a first tool gripper of said at least two movable tool grippers containing a first used tool such that said axis is in alignment with the tool storage location;

b. energizing at least one of said multi-action cylinders coupled to said first tool gripper to move said first tool gripper containing said first used tool, parallel to said central axis of said first tool gripper and generally perpendicular to said work table, to insert said first used tool into said tool storage location;

c. moving the tool changing apparatus along said path to position the central axis of a second tool gripper of said at least two tool grippers, at a tool retrieve location in alignment with a next tool to be retrieved during the work cycle of said machine tool;

d. retrieving the next tool to be used with said second tool gripper;

e. moving the spindle to a tool change position on completion of the work cycle;

f. moving the tool changing apparatus along said path to position the central axis of said first tool gripper at the tool change position such that said central axis is in alignment with said spindle;

g. energizing at least one of said multi-action cylinders to move said first tool gripper along the central axis of said first tool gripper to grip a second used tool in said spindle;

h. unloading said second used tool from the spindle;

i. moving the tool changing apparatus along said path to position said second tool gripper containing said next tool so that the central axis of said next tool at the tool change position is aligned with the central axis of said spindle;

j. loading the retrieved next tool into the spindle;

k. moving the spindle to a work location to commence a new work cycle;

l. moving the tool changing apparatus to the tool changer park position;

m. moving a pressure foot insert storage pod having a pressure foot insert mounted thereon to the tool change position after loading the next tool in the spindle; and n. loading the pressure foot insert onto the spindle.

3. A method for controlling a machine tool including a spindle, a work table and a tool changing apparatus having at least two movable tool grippers each gripper having a multi-action cylinder coupled thereto for movement of said gripper along a central axis of said gripper generally perpendicular to the plane of said work table comprising the steps of:

a. moving said tool changing apparatus from a changer park position to a tool storage location along a path parallel to the plane of said work table during a work cycle of the machine tool to position the central axis of a first tool gripper of said at least two movable tool grippers containing a first used tool such that said axis is in alignment with the tool storage location;

b. energizing at least one of said multi-action cylinders coupled to said first tool gripper to move said first tool gripper containing said first used tool, parallel to said central axis of said first tool gripper and generally perpendicular to said work table, to insert said first used tool into said tool storage location;

c. moving the tool changing apparatus along said path to position the central axis of a second tool gripper of said at least two tool grippers, at a tool retrieve location in alignment with a next tool to be retrieved during the work cycle of said machine tool;

d. retrieving the next tool to be used with said second tool gripper;

e. moving the spindle to a tool change position on completion of the work cycle;

f. moving the tool changing apparatus along said path to position the central axis of said first tool gripper at the tool change position such that said central axis is in alignment with said spindle;

g. energizing at least one of said multi-action cylinders to move said first tool gripper along the central axis of said first tool gripper to grip a second used tool in said spindle;

h. unloading said second used tool from the spindle;

i. moving the tool changing apparatus along said path to position said second tool gripper containing said next tool so that the central axis of said next tool at the tool change position is aligned with the central axis of said spindle;

j. loading the retrieved next tool into the spindle;

k. moving the spindle to a work location to commence a new work cycle;

l. moving the tool changing apparatus to the tool changer park position;

m. moving a pressure foot insert storage pod to the tool change position during the machine tool work cycle; and n. retrieving a pressure foot insert prior to unloading the second used tool from the spindle;

o. moving the pressure foot insert storage pod having the pressure foot insert to the tool change position after loading the next tool in the spindle; and p. loading the pressure foot insert onto the spindle.

4. A method for operating a tool changing apparatus positioned on a machine tool said machine tool having a control apparatus for implementing said method and having at least one spindle and a moveable work table, said tool changing apparatus accessing a changer park position, a tool change position for changing a used tool and inserting a next tool to be used into said spindle and a tool storage location for storing said used tool in a tool storage device and a tool retrieve location for retrieving said next tool to be used during at least a part of a work cycle of the machine tool said tool changing apparatus moveable between said changer park position, said tool storage location, said tool retrieve location and said tool change position during at least a part of the work cycle of the machine tool, and wherein said machine tool changing apparatus includes at least one pressure foot insert storage pod and at least one pressure foot insert accessible by said tool changing apparatus said method comprising the following steps:

a. moving said tool changing apparatus from said changer park position to said tool storage location during the work cycle;

b. storing the used tool in said tool storage device at said tool storage location;

c. moving said tool changing apparatus to said tool retrieve location during the machine tool work cycle;

d. retrieving the next tool;

e. moving the spindle to the tool change position on completion of the work cycle;

f. moving the tool changing apparatus to the tool change position;

g. unloading the used tool from the spindle;

h. loading the retrieved next tool into the spindle;

i. moving the spindle to a work location to commence the work cycle;

j. moving the tool changing apparatus to said changer park position;

k. moving the pressure foot insert storage pod to the tool change position prior to unloading the used tool from the spindle; and l. retrieving the pressure foot insert onto said pressure foot insert storage pod prior to unloading the used tool from the spindle.

5. A method for operating a tool changing apparatus positioned on a machine tool said machine tool having a control apparatus for implementing said method and having at least one spindle and a moveable work table, said tool changing apparatus accessing a changer park position, a tool change position for changing a used tool and inserting a next tool to be used into said spindle and a tool storage location for storing said used tool in a tool storage device and a tool retrieve location for retrieving said next tool to be used during at least a part of a work cycle of the machine tool said tool changing apparatus moveable between said changer park position, said tool storage location, said tool retrieve location and said tool change position during at least a part of the work cycle of the machine tool, and wherein said machine tool changing apparatus includes at least one pressure foot insert storage pod and at least one pressure foot insert accessible by said tool changing apparatus said method comprising the following steps:

a. moving said tool changing apparatus from said changer park position to said tool storage location during the work cycle;

b. storing the used tool in said tool storage device at said tool storage location;

c. moving said tool changing apparatus to said tool retrieve location during the machine tool work cycle;

d. retrieving the next tool;

e. moving the spindle to the tool change position on completion of the work cycle;

f. moving the tool changing apparatus to the tool change position;

g. unloading the used tool from the spindle;

h. loading the retrieved next tool into the spindle;

i. moving the spindle to a work location to commence the work cycle;

j. moving the tool changing apparatus to said changer park position;

k. moving said pressure foot insert storage pod having a pressure foot insert stored thereon to the tool change position after loading the next tool in the spindle; and l. loading the pressure foot insert on the spindle.

6. A method for operating a tool changing apparatus positioned on a machine tool said machine tool having a control apparatus for implementing said method and having at least one spindle and a moveable work table, said tool changing apparatus accessing a changer park position, a tool change position for changing a used tool and inserting a next tool to be used into said spindle and a tool storage location for storing said used tool in a tool storage device and a tool retrieve location for retrieving said next tool to be used during at least a part of a work cycle of the machine tool said tool changing apparatus moveable between said changer park position, said tool storage location, said tool retrieve location and said tool change position during at least a part of the work cycle of the machine tool, and wherein said machine tool changing apparatus includes at least one pressure foot insert storage pod and at least one pressure foot insert accessible by said tool changing apparatus said method comprising the following steps:

a. moving said tool changing apparatus from said changer park position to said tool storage location during the work cycle;

b. storing the used tool in said tool storage device at said tool storage location;

c. moving said tool changing apparatus to said tool retrieve location during the machine tool work cycle;

d. retrieving the next tool;

e. moving the spindle to the tool change position on completion of the work cycle;

f. moving the tool changing apparatus to the tool change position;

g. unloading the used tool from the spindle;

h. loading the retrieved next tool into the spindle;

i. moving the spindle to a work location to commence the work cycle;

j. moving the tool changing apparatus to said changer park position;

k. moving said pressure foot insert storage pod to the tool change position prior to unloading the used tool from the spindle; and l. retrieving the pressure foot insert onto said pressure foot insert storage pod prior to unloading the used tool from the spindle;

m. moving a pressure foot insert storage pod including said pressure foot insert to the tool change position after loading the next tool in the spindle; and n. loading the pressure foot insert on the spindle.

7. A method for controlling a tool changing apparatus positioned on a machine tool said machine tool having a control apparatus for implementing said method and having at least one spindle and a moveable work table, said tool changing apparatus having at least one tool gripper, having an adjustment pad, adapted to be positioned at a tool storage device and grip selectable to permit adjustment of a tool having a shank within said tool gripper said method comprising the following steps:

a. gripping the shank of said tool sufficient to hold said tool in said gripper;

b. removing said tool from said tool storage device;

c. changing the grip of said gripper sufficient to allow said tool to slide axially within said gripper until said tool engages said pad;

d. gripping said tool sufficient to hold said tool in said gripper after engagement with said pad.

8. A method for controlling said tool changing apparatus as described in claim 7 further comprising means for moving said at least one tool gripper along an axis generally perpendicular to said work table and inserting said tool into said spindle or extracting said tool from said spindle.

9. A method for controlling a tool changing apparatus positioned on a machine tool controlled by a computer said machine tool having at least one spindle, a moveable work table and a tool storage device at a tool storage location, said tool changing apparatus having a first slide moveable along a first axis parallel to said work table, and a second slide supported by said first slide moveable along a second axis parallel to said work table and transverse to said first axis and a gripper platform mounted on said second slide, for supporting at least one first gripper and at least one second gripper each adapted for gripping a tool having a shank, said tool changing apparatus moveable to a changer park position, a tool change position, said tool storage location, a tool retrieve location, during at least a part of a work cycle of the machine tool, independent of movement of said work table, and wherein said second gripper has multiple position jaws for gripping said tool and an axial adjustment pad positioned below the jaws of said second gripper said method implemented by a computer program in said computer comprising the following steps:

a. moving said tool changing apparatus from said changer park position to said tool storage location during the work cycle;

b. moving said first slide and said second slide along said first axis and said second axis to position said first tool gripper containing said tool at said tool storage device;

c. moving said first gripper perpendicular to said first axis and said second axis to insert said tool into said tool storage location;
d. opening said first gripper to release said tool;
e. moving said first tool gripper away from said tool storage device;
f. moving said first slide and said second slide to position said second tool gripper at said tool retrieve location during the work cycle;
g. moving said second gripper toward said tool storage device to position said second gripper at said tool storage location;
h. closing said second tool gripper to grip said tool to be retrieved from said tool storage location;
i. moving said second tool gripper gripping said tool away from said tool storage device;
j. moving said first slide and said second slide to position said first gripper at the tool change position;
k. opening said first tool gripper;
l. moving the spindle to the tool change position on completion of the work cycle;
m. moving said first tool gripper toward said spindle to place said first tool gripper in engagement with the tool mounted in the spindle;
n. closing said first tool gripper to grasp said used tool in said spindle;
o. releasing said tool from said spindle;
p. moving said first tool gripper away from said spindle;
q. moving said first slide and said second slide to position said second tool gripper in alignment with said spindle;
r. moving said second gripper toward said spindle to insert said tool in said second gripper into said spindle;
s. gripping said tool by said spindle;
t. releasing said tool by said second gripper;
u. moving said second gripper away from said spindle;
v. moving the spindle to a work location to commence the work cycle;
w. moving said first slide and said second slide to position the tool changing apparatus at said changer park position;
x. changing the position of the jaws of said second gripper sufficient to allow said tool retrieved from said tool storage location to slide axially within said gripper until said tool engages said pad; and
y. closing the jaws of said second gripper to grip said tool sufficient to prevent further axial movement.

10. A method for controlling a tool changing apparatus positioned on a machine tool controlled by a computer said machine tool having at least one spindle, a moveable work table and a tool storage device at a tool storage location, said tool changing apparatus having a first slide moveable along a first axis parallel to said work table, and a second slide supported by said first slide moveable along a second axis parallel to said work table and transverse to said first axis and a gripper platform mounted on said second slide, for supporting at least one first gripper and at least one second gripper each adapted for gripping a tool having a shank, said tool changing apparatus moveable to a changer park position, a tool change position, said tool storage location, a tool retrieve location, during at least a part of a work cycle of the machine tool, independent of movement of said work table, and wherein said tool changing apparatus includes at least one pressure foot insert storage pod mounted on said gripper platform and at least one pressure foot insert accessible by said tool changing apparatus said method implemented by a computer program in said computer comprising the following steps:

a. moving said tool changing apparatus from said changer park position to said tool storage location during the work cycle;
b. moving said first slide and said second slide along said first axis and said second axis to position said first tool gripper containing said tool at said tool storage device;
c. moving said first gripper perpendicular to said first axis and said second axis to insert said tool into said tool storage location;
d. opening said first gripper to release said tool;
e. moving said first tool gripper away from said tool storage device;
f. moving said first slide and said second slide to position said second tool gripper at said tool retrieve location during the work cycle;
g. moving said second gripper toward said tool storage device to position said second gripper at said tool storage location;
h. closing said second tool gripper to grip said tool to be retrieved from said tool storage location;
i. moving said second tool gripper gripping said tool away from said tool storage device;
j. moving said first slide and said second slide to position said first gripper at the tool change position;
k. opening said first tool gripper;
l. moving the spindle to the tool change position on completion of the work cycle;
m moving said first tool gripper toward said spindle to place said first tool gripper in engagement with the tool mounted in the spindle;
n. closing said first tool gripper to grasp said used tool in said spindle;
o. releasing said tool from said spindle;
p. moving said first tool gripper away from said spindle;
q. moving said first slide and said second slide to position said second tool gripper in alignment with said spindle;
r. moving said second gripper toward said spindle to insert said tool in said second gripper into said spindle;
s. gripping said tool by said spindle;
t. releasing said tool by said second gripper;
u. moving said second gripper away from said spindle;
v. moving the spindle to a work location to commence the work cycle;
w. moving said first slide and said second slide to position the tool changing apparatus at said changer park position;
x. moving said pressure foot insert storage pod having said pressure foot insert to the tool change position after loading the tool in the spindle;
y. moving said spindle to engage said pressure foot insert on the pressure foot insert storage pod;
z. eliminating vacuum pressure in said pressure foot insert storage pod to release said pressure foot insert; and
aa. moving said spindle away from said pressure foot storage pod.

* * * * *